United States Patent [19]
Armstrong et al.

[11] Patent Number: 6,072,163
[45] Date of Patent: Jun. 6, 2000

[54] COMBINATION BAKE/CHILL APPARATUS INCORPORATING LOW THERMAL MASS, THERMALLY CONDUCTIVE BAKEPLATE

[75] Inventors: Keith H. Armstrong, Sherman; Kevin G. Kemp, Dallas; Faqiu (Frank) Liang; Natarajan Ramanan, both of Plano, all of Tex.

[73] Assignee: FSI International Inc., Chaska, Minn.

[21] Appl. No.: 09/035,628

[22] Filed: Mar. 5, 1998

[51] Int. Cl.[7] .................................................... H04B 1/02
[52] U.S. Cl. ............... 219/497; 219/121.43; 219/121.58; 219/494; 118/724; 374/1; 392/416; 438/660
[58] Field of Search .................... 219/494, 497, 219/501, 505, 121.43, 121.4, 121.58; 118/724, 725; 374/1; 392/416; 437/660, 663, 715; 156/345

[56] References Cited

U.S. PATENT DOCUMENTS

| | | | |
|---|---|---|---|
| 3,612,165 | 10/1971 | Haynes | 165/26 |
| 3,956,936 | 5/1976 | Brixy | 73/359 |
| 3,966,500 | 6/1976 | Brixy | 136/232 |
| 4,030,015 | 6/1977 | Herko et al. | 321/2 |
| 4,113,391 | 9/1978 | Minowa | 219/216 |
| 4,443,117 | 4/1984 | Muramoto et al. | 374/1 |
| 4,475,823 | 10/1984 | Stone | 374/1 |
| 4,486,652 | 12/1984 | Muka et al. | 219/553 |
| 4,627,744 | 12/1986 | Brixy et al. | 374/175 |
| 4,903,754 | 2/1990 | Hirscher et al. | 165/1 |
| 5,226,472 | 7/1993 | Benevelli et al. | 165/30 |
| 5,252,807 | 10/1993 | Chizinsky | 219/390 |
| 5,291,514 | 3/1994 | Heitmann et al. | 373/135 |
| 5,410,162 | 4/1995 | Tigelaar et al. | 257/48 |
| 5,411,076 | 5/1995 | Matsunaga et al. | 118/725 |
| 5,484,011 | 1/1996 | Tepman et al. | 165/1 |
| 5,567,267 | 10/1996 | Kazama et al. | 118/725 |
| 5,584,971 | 12/1996 | Konino | 204/298.13 |
| 5,595,241 | 1/1997 | Jelinek | 165/80.1 |
| 5,802,856 | 9/1998 | Schaper et al. | 392/416 |
| 5,892,207 | 4/1999 | Kawamura et al. | 219/492 |

OTHER PUBLICATIONS

*Basics of Design Engineering*, "DSPs find a place in motor control," pp. 95–95–96, 98, 100–102, Nov. 6, 1997.

*Primary Examiner*—Mark Paschall
*Attorney, Agent, or Firm*—Faegre & Benson, LLP.

[57] ABSTRACT

Systems and methods that make it possible to rapidly cycle a workpiece through a temperature/time profile over a wide temperature range, e.g., 0° C. to 350° C., without having to lift and transfer the workpiece between separate baking and chilling mechanisms. The present invention is based in part upon the concept of using a low thermal mass, thermally conductive heating member to support a workpiece, such as a microelectronic device, during both baking and chilling operations. While supporting the workpiece on one surface, the other surface of the heating member can be brought into and out of thermal contact with a relatively thermally massive chill plate to easily switch between baking and chilling operations. A simple mechanism is all that is required to either physically separate the heating member and chill plate to accomplish the most rapid heating, or the simple mechanism adjoins the heating member and chill plate to accomplish the most rapid chilling. This approach completely eliminates the need to rely upon a workpiece handling mechanism in order to lift and transfer a microelectronic device from a heating member to a separate chill plate. This approach also allows both chilling and baking to occur from a direction below the microelectronic device.

87 Claims, 19 Drawing Sheets

COMBINATION BAKE/CHILL APPARATUS INCORPORATING LOW THERMAL MASS, THERMALLY CONDUCTIVE BAKEPLATE

FIELD OF THE INVENTION

The present invention relates to systems and methods for processing a workpiece through a temperature profile preferably involving at least one heating step and/or at least one cooling step. More particularly, the present invention relates to a bake/chill apparatus that processes a workpiece through temperature profile(s) typically involving holding the workpiece at one or more precise equilibrium temperatures with rapid response when temperature shifts from one equilibrium temperature to another, as desired.

BACKGROUND OF THE INVENTION

The manufacture of many products requires precise control over temperature and temperature changes. For example, the manufacture of microelectronic devices, such as integrated circuits, flat panel displays, thin film heads, and the like, involves applying a layer of some material, such as a photoresist, onto the surface of a substrate (such as a semiconductor wafer in the case of integrated circuits). Photoresists, in particular, must be baked and then chilled to set or harden selected portions of the photoresist during processing. The baking and chilling steps must be precisely controlled within exacting temperature constraints to ensure that the selected portions of the photoresist properly set with good resolution. Other products and processes involving exacting temperature constraints include medical products and processes including drug preparation, instrument sterilization, and bioengineering; accelerated life testing methodologies; injection molding operations; piezoelectric devices; photographic film processing; material deposition processes such as sputtering and plating processes; micromachine manufacture; ink jet printing; fuel injection; and the like.

Baking and chilling operations for microelectronic devices typically involve cycling a workpiece through a desired temperature profile in which the workpiece is maintained at an elevated equilibrium temperature, chilled to a relatively cool equilibrium temperature, and/or subjected to temperature ramps of varying rates (in terms of ° C./s) between equilibrium temperatures. To accomplish baking and chilling, previously known bake/chill operations have included separate bake and chill plates that have required the use of a workpiece transport mechanism in order to physically lift and transfer the workpiece itself from one plate to the other. This approach presents a number of drawbacks. First, workpiece temperature is not controlled during transfer between bake and chill plates. Second, the overall time required to complete the bake/chill process cannot be precisely controlled, because of the variable time required to move the workpiece to and from the respective plates. Third, the required movement takes time and thus reduces the throughput of the manufacturing process. Fourth, the cost of equipment is higher than necessary because the apparatus requires extra components to handle the workpiece during transport from plate to plate. Fifth, the mechanical move from plate to plate introduces the possibility of contaminating of the workpiece. Thus, it would be desirable to be able to accomplish both baking and chilling without having to physically lift and transport the workpiece itself from a bakeplate over to a separate chill plate and vice versa.

Baking typically involves heating a workpiece up to a specific elevated, equilibrium temperature and then maintaining the workpiece at that particular equilibrium temperature for a defined period of time. Throughput of the manufacturing process is affected by the rate at which the workpiece can be heated up to the equilibrium temperature. Slower temperature ramp rates require longer times to reach the equilibrium temperature and therefore result in lower manufacturing throughput. Similarly, chilling typical involves cooling the workpiece from a relatively high temperature down to a relatively low, chill equilibrium temperature. Again, slower chilling rates require longer times to complete chilling and therefore also cause lower manufacturing throughput. Accordingly, in order to improve manufacturing throughput, it would be desirable to increase the rate at which the workpiece temperature can be changed during baking and/or chilling so that the workpiece can be brought to the heating or chill equilibrium temperatures faster. It would also be desirable to be able to accurately control the rate at which workpiece temperature is changed during baking and chilling.

Even if the bake and chilling rates were to be increased, it would still be necessary to accurately control the temperature of the workpiece throughout the bake/chill process to make sure that the exacting temperature specifications for workpiece production are satisfied. For example, if chilling and/or baking rates as fast as 1° C./s to 50° C./s, preferably 5° C./s to 15° C./s, were to be used, the control approach would need to be agile enough to be able to control the workpiece temperature commensurately with such rapid temperature changes. The conventional control approaches currently used for heater control generally lack the requisite agility to be able to keep up with a bake/chill station having such capabilities.

With respect to the manufacture of microelectronic devices, current practices also involves using a relatively massive bakeplate. Massive bakeplates typically require relatively long periods of time, e.g., periods up to 30 minutes, in order to change from one temperature and come to equilibrium at a new temperature. Accordingly, to avoid having to wait so long each time a baking temperature is changed, current practice often involves using multiple bakeplates set at different equilibrium temperatures, a workpiece handler to transfer workpieces from one bakeplate to the next, and fixed, slow, temperature ramp rates.

SUMMARY OF THE INVENTION

The present invention provides systems and methods that make it possible to rapidly cycle a workpiece through a temperature/time profile over a wide temperature range e.g., 0° C. to 350° C., without having to lift and transfer the workpiece between separate baking and chilling mechanisms. The systems and methods of the present invention are useful for processing microelectronic devices such as flat panel displays, thin film heads for computer disk drives, and semiconductor devices; medical products and processes including drug preparation, instrument sterilization, and bioengineering; accelerated life testing; injection molding operations; piezoelectric devices; photographic film processing; material deposition processes such as sputtering and plating processes; micromachine manufacture; ink jet printing; fuel injection; and the like.

Preferably, the systems and methods of the present invention are used for processing microelectronic devices. In this regard, embodiments of the present invention in the form of bake/chill systems are particularly useful as a component to be incorporated into the POLARIS® microlithography cluster manufactured by FSI International, Inc., Chaska, Minn.

The POLARIS® microlithography cluster is a tool cluster comprising a plurality of workstations for manufacturing integrated circuits formed on semiconductor wafer substrates. The features of the POLARIS® microlithography cluster are described in the "POLARIS® 2100/2200 Microlithography Cluster Product Specification, 506026-001 Rev. A, Nov. 1, 1996", the disclosure of which is incorporated herein by reference.

The present invention allows precise, flexible specification of temperature profiles, bake equilibrium temperatures, and chill equilibrium temperatures. For example, when the system is being used to process integrated circuits formed on a semiconductor wafer substrate (also referred to herein as a "semiconductor device"), across-the-workpiece temperature uniformity can be controlled to within 0.2° C. at equilibrium, and average workpiece temperature can be controlled to within 0.01° C. over time. The system is remarkably simple while providing substantial improvement in bake/chill capabilities and performance.

The present invention is based in part upon the concept of using a low thermal mass, thermally conductive bakeplate to support a workpiece, such as a semiconductor device, during both baking and chilling operations. While supporting the workpiece on one surface, the other surface of the bakeplate can be brought into and out of thermal contact with a relatively thermally massive chill plate to easily switch between baking and chilling operations. A simple mechanism is all that is required to either physically separate the bakeplate and chill plate to accomplish the most rapid heating, or the simple mechanism adjoins the bakeplate and chill plate to accomplish the most rapid chilling. This approach completely eliminates the need to rely upon a workpiece handling mechanism in order to lift and transfer a semiconductor device from a bakeplate to a separate chill plate. This approach also allows both chilling and baking to occur from a direction below the semiconductor device.

In preferred embodiments, the bakeplate rests on top of the chill plate during chilling, and one or both of these components is raised or lowered, as the case may be, to separate them during baking. The switch between baking and chilling configurations can be accomplished very quickly, e.g., as quickly as a fraction of a second up to a couple of seconds at most.

The bakeplate preferably is in the form of a relatively thin, sheet-shaped heating member having opposed major surfaces and whose heat output is controllable. The low thermal mass of this kind of bakeplate provides advantages during both baking and chilling. During chilling, when the bakeplate is placed into thermal contact with the chill plate, the cooling effects of the chill plate are quickly imparted to the semiconductor device via conduction through the bakeplate. Thus, the workpiece is chilled right through the bakeplate without ever having to physically remove the workpiece from the bakeplate and transfer it over to the chill plate. During baking, the low thermal mass also allows heating rates as fast as 1° C./s to 50° C./s, preferably 5° C./s to 15° C./s, to be achieved. Not only is the temperature response this fast, but the thermal profile during baking can also be shaped with any desired number of temperature steps and temperature ramps for exceptional flexibility and precision.

In preferred embodiments, the present invention uses a dynamic "chill boost" approach in order to rapidly chill or heat the workpiece to the desired chill or bake equilibrium temperature. According to one particularly preferred mode of practicing the invention in connection with chilling, the "chill boost" approach involves stopping further chilling and maintaining the workpiece at a desired equilibrium temperature with exceptional ease and precision simply by adding just enough heat to the bakeplate while keeping the bakeplate in thermal contact with the chill plate. According to one particularly preferred mode of practicing the invention in connection with baking, the "chill boost" approach involves stopping further baking and maintaining the workpiece at a desired equilibrium temperature with exceptional ease and precision simply by reducing the power output of the bakeplate while the bakeplate is in thermal contact with the chill plate. During chilling or baking, as the case may be, the workpiece temperature is dynamically monitored so that additional chilling or heating can be stopped when the desired equilibrium temperature is reached. The chill boost approach not only reduces processing time by as much as 33% as compared to conventional approaches, but the workpiece also ends up at a precisely known temperature.

Also in preferred embodiments, the bakeplate may incorporate a frame member, e.g., an annular-shaped frame in the case of semiconductor device processing, that surrounds the workpiece during baking and chilling. The frame member provides many benefits. Firstly, the workpiece fits into the interior space of the frame member, and this helps to ensure proper registration with the underlying heating zone provided in the bakeplate. More importantly, however, the frame member significantly enhances the uniformity by which the workpiece is baked or chilled. For instance, when the heating zone of the bakeplate is large enough to underlie both the frame member and the workpiece, the frame member helps distribute heat from the bakeplate and helps smooth out heating variations that might otherwise occur at the workpiece edge. In particular, any nonuniformities in heating would tend to occur around the outer periphery of the frame member rather than at the edge of the workpiece, as would be the case if the frame member were to be absent. The frame member also helps reduce the occurrences of convective heat losses from the edge of the workpiece. The thermal mass of the frame member also reduces the non-uniform heating effects that would otherwise tend to occur with variations in workpiece diameter.

As still another advantage, the frame member may be configured so that the temperatures of the top surfaces of the frame member and the workpiece correspond to each other in a predictable manner over the full range of bake/chill operations. Consequently, the temperature of the frame member can be monitored as an indirect, convenient, highly accurate way to monitor workpiece temperature.

The present invention also relates to a control system that incorporates a number of innovative features that provide precise, agile control over the baking and chilling process. In particular, the control system uses a pulse width modulated (PWM) control signal to modulate the amount of DC electric energy to be supplied to the bakeplate. In preferred embodiments, this involves converting 60 Hz AC power received from a utility into a DC voltage that is modulated using a 20,000 Hz PWM control signal in which the duty cycle of each control signal pulse is controllably varied to adjust the amount of DC power that reaches the heater. In a particularly preferred embodiment, the electrical voltage supplied to the bakeplate (the bakeplate voltage) is proportional to the duty cycle of the PWM control signal, and the heat output of the bakeplate is proportional to the square of the bakeplate voltage.

Thus, if the DC power is supplied at 300 volts and the duty cycle of the PWM control signal is at 50%, the voltage across the bakeplate would be 150 volts (i.e., 50% of 300 volts). A corresponding heat output would then be developed. Advantageously, therefore, the heat output of the bakeplate is easily increased or decreased merely by adjusting the duty cycle of the PWM control signal. Techniques of proportional-integral-derivative (PID) control are preferably applied to control the bakeplate temperature during baking and/or chilling.

Because the innovative control system is so fast and precise, the control system practically eliminates the "saw tooth" temperature profiles associated with the slower, more sluggish control approaches that have been previously used to control heaters. Those slower control approaches might be suitable for massive bakeplates with large time constants, but are not suitable for use in the present invention in which the bakeplate time constant is so small.

In one aspect, the present invention relates to a combination baking and chilling apparatus suitable for cycling a workpiece through a temperature profile comprising at least one baking step and at least one chilling step. The apparatus comprises a low thermal mass, thermally conductive, bakeplate having a supporting surface adapted for supporting the workpiece in thermal contact with the bakeplate such that heat energy from the bakeplate can be transferred to the workpiece during baking. The apparatus also includes a high thermal mass chilling member. The apparatus operatively supports the bakeplate and the chilling member in at least a first configuration in which the chilling member is in thermal contact with the bakeplate.

In another aspect, the present invention relates to a heating device for heating a microelectronic device. The device includes a heating member and a frame member provided on a surface of the heating member. The frame member has an interior space adapted to receive the workpiece.

In another aspect, the present invention relates to a system for controlling the temperature of an object. The system includes at least one temperature sensor coupled to the system in a position effective to generate output temperature signals indicative of the temperature of the object. A source of a pulse width modulated (PWM) control signal having a controllably variable duty cycle is also included in the system, wherein the PWM control signal is derived from information comprising the temperature signals A heating member of the system comprises a surface for supporting the object during heating. The heating member has a controllable heat output that can be established at an output level corresponding to the duty cycle of the PWM control signal.

In another aspect, the present invention relates to a method of cooling a workpiece to a cooled temperature ($T_c$). According to the method, the workpiece is supported in thermal contact with a low thermal mass, thermally conductive support, wherein the workpiece is at a temperature above $T_c$. The low thermal mass support is placed into thermal contact with a chilling member maintained at a temperature below $T_c$ such that the workpiece is subjected to cooling via heat conduction through said support. The temperature of the support is monitored during cooling. Chilling is stopped when the support is at a temperature substantially corresponding to $T_c$.

In another aspect, the present invention relates to a sheet-shaped, laminated, low thermal mass, thermally conductive heating member for heating a workpiece. The heating member includes first and second opposed major surfaces corresponding to a workpiece supporting surface and a workpiece chilling surface, respectively, wherein a workpiece positioned on the supporting surface can be chilled when the chilling surface is, placed into thermal contact with a heat sink.

In another aspect, the present invention relates to an apparatus for controlling the temperature of a workpiece. The apparatus includes a sheet-shaped heating member comprising first and second opposed major surfaces corresponding to a workpiece supporting surface and a workpiece chilling surface, respectively. The apparatus also includes a chilling member. The apparatus operatively supports the heating member and the chilling member in a first configuration in which the heating member and the chilling member are subjected to a bias tending to pull the workpiece chilling surface into thermal contact with the chilling member. The apparatus also operatively supports the heating member and the chilling member in a second configuration in which the bias is overcome and the workpiece chilling surface and the chilling member are thermally decoupled.

In another aspect, the present invention relates to a method of baking and chilling a workpiece. The workpiece is heated while the workpiece is supported upon a sheet-shaped heating member comprising first and second opposed major surfaces. The first major surface supports the workpiece. The second major surface of the bakeplate is placed into thermal contact with a chilling member. While the second major surface of the bakeplate is in thermal contact with the chilling member, the heat output of the heating member is controlled such that the workpiece supported upon the first major surface is chilled.

In another aspect, the present invention relates to a method of baking a workpiece. The workpiece is heated while the workpiece is supported upon a sheet-shaped, laminated, heating member comprising a substantially planar substrate ply and a heater ply laminated to the substrate ply. The heater ply comprises at least one controllable heater zone.

In another aspect, the present invention relates to a method of chilling a workpiece. A workpiece is supported upon a sheet-shaped heating member comprising first and second opposed major surfaces. The first major surface supports the workpiece. The second major surface of the bakeplate is placed into thermal contact with a chilling member. While the second major surface of the bakeplate is in thermal contact with the chilling member, the heat output of the heating member is controlled such that the workpiece supported upon the first major surface is chilled.

In another aspect, the present invention relates to a method of maintaining a workpiece at an equilibrium temperature. A workpiece is supported upon a sheet-shaped heating member comprising first and second opposed major surfaces. The first major surface supports the workpiece. The second major surface of the bakeplate is placed into thermal contact with a chilling member. While the second major surface of the bakeplate is in thermal contact with the chilling member, the heat output of the heating member is controlled such that the workpiece is maintained at said equilibrium temperature.

In another aspect, the present invention relates to a tool cluster for manufacturing microelectric devices. The tool cluster includes a low thermal mass, thermally conductive, heating member having a surface adapted for supporting the workpiece in thermal contact with the heating member such that heat energy from the heating member can be transferred to the workpiece. A high thermal mass chilling member is also included. The apparatus operatively supports the heating member and the chilling member in at least a first configuration in which the chilling member is in thermal contact with the heating member.

BRIEF DESCRIPTION OF THE DRAWINGS

The above mentioned and other advantages of the present invention, and the manner of attaining them, will become more apparent and the invention itself will be better understood by reference to the following description of the embodiments of the invention taken in conjunction with the accompanying drawings, wherein:

FIG. 2b is a top view of a heater ply incorporated into the bakeplate of FIG. 2a;

FIG. 5b is a side view, in cross-section, of the radial tensioning apparatus of FIG. 5a;

FIG. 5c is a top view of a substrate of the present invention having peripheral cuts to facilitate placement on the radial tensioning apparatus of FIG. 5a;

DETAILED DESCRIPTION OF THE PRESENTLY PREFERRED EMBODIMENTS

The embodiments of the present invention described below are not intended to be exhaustive or to limit the invention to the precise forms disclosed in the following detailed description. Rather the embodiments are chosen and described so that others skilled in the art may appreciate and understand the principles and practices of the present invention.

Figure 1A:
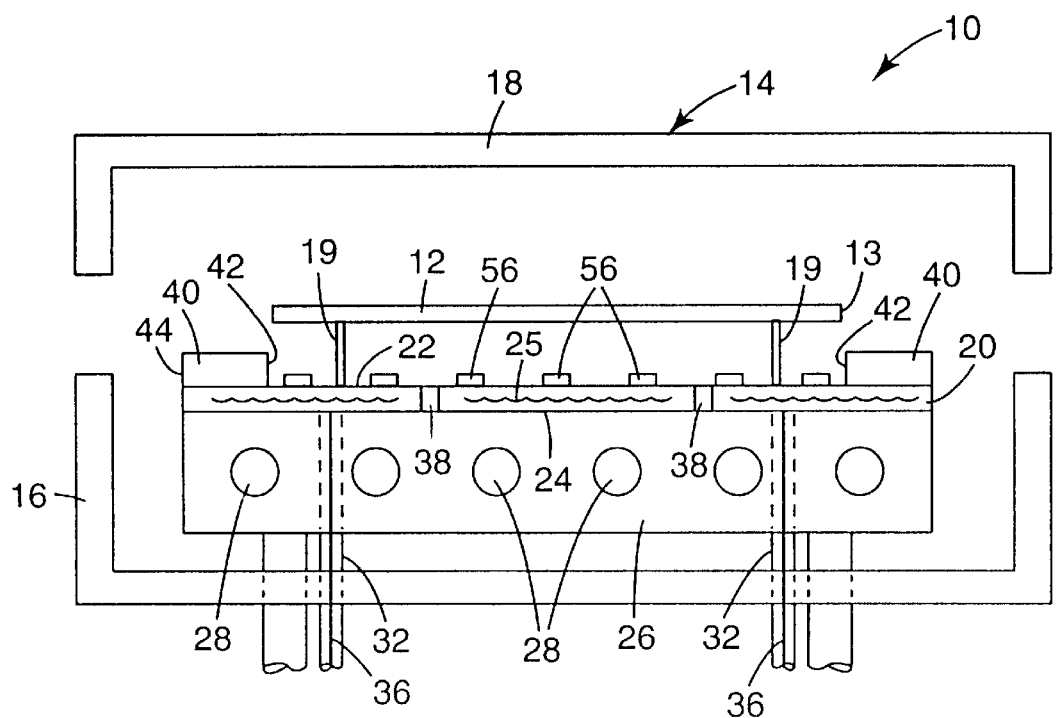
FIG. 1a is a schematic representation of a bake/chill apparatus of the present invention shown in side view in a "ready" configuration.
Figure 1B:
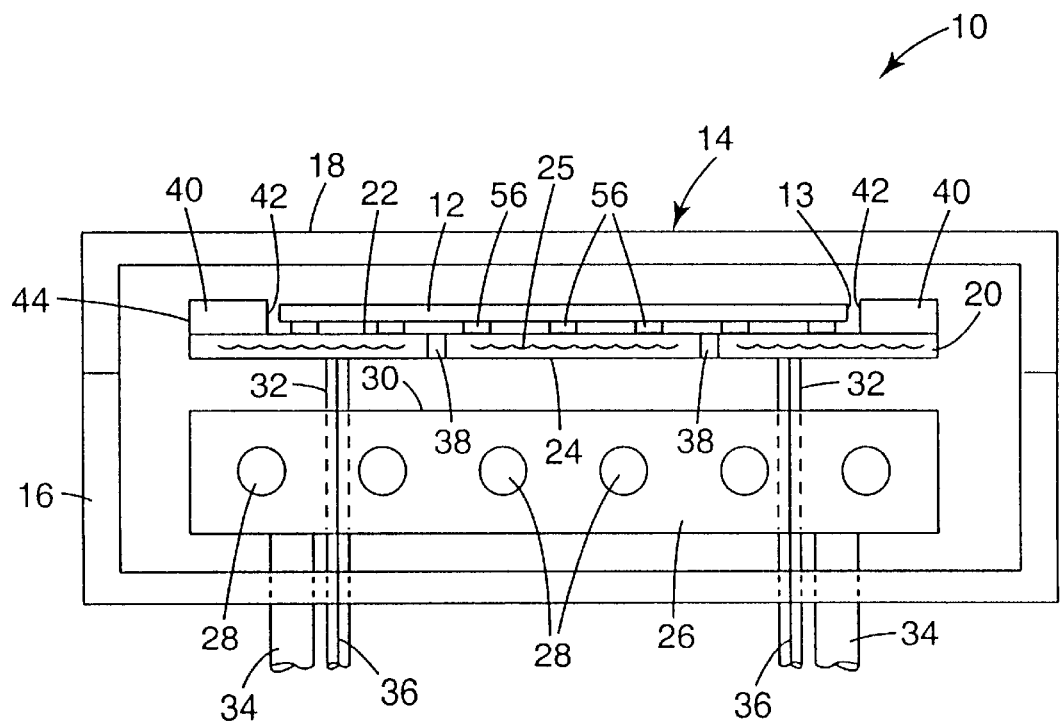
FIG. 1b is a schematic representation of a bake/chill apparatus of the present invention shown in side view in a "baking" configuration.
Figure 1C:
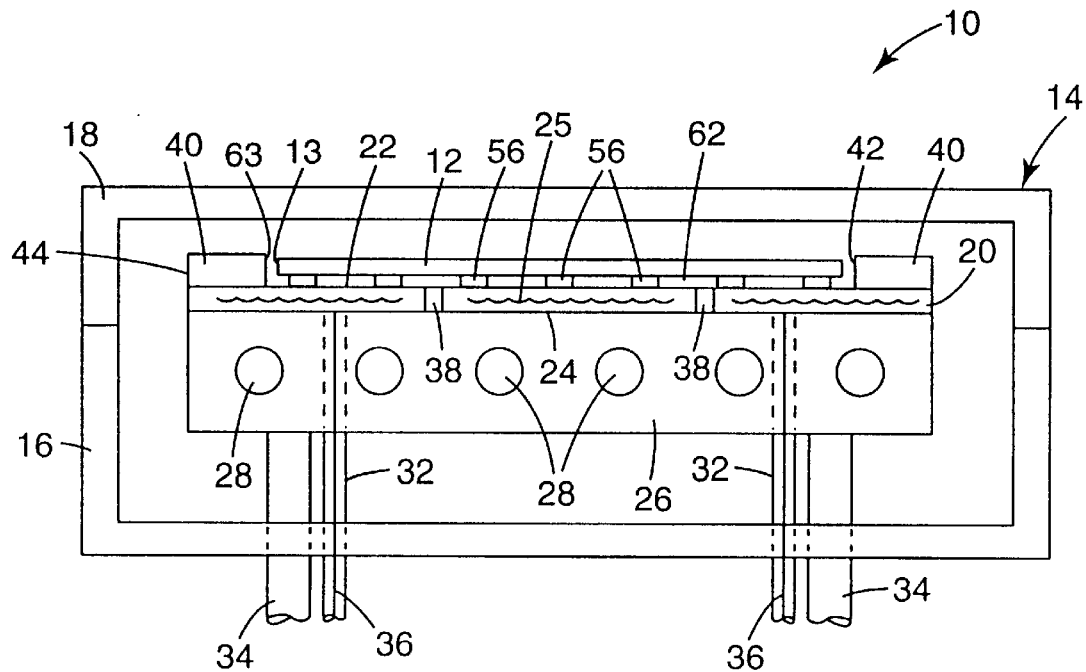
FIG. 1c is a schematic representation of a bake/chill apparatus of the present invention shown in side view in a "chilling" configuration.

FIGS. 1a, 1b, and 1c schematically represent three configurations, respectively, of a preferred embodiment of a combination baking and chilling apparatus 10 (hereinafter also referred to as "bake/chill apparatus 10") suitable for cycling a workpiece, such as semiconductor device 12, through a temperature profile comprising at least one baking step and at least one chilling step. Bake/chill apparatus 10 includes housing 14 having bottom housing member 16 and top cover 18. Bottom housing member 16 and top cover 18 can be separated from each other as shown in FIG. 1a or brought together as shown in FIGS. 1b (baking configuration) and 1c (chilling configuration) in order to repeatedly open and close housing 14. When housing 14 is open, semiconductor device 12 may be inserted into housing 14 and placed onto stationary support pins 19 in preparation for baking and chilling.

After the wafer 12 is inserted into housing 14, housing 14 can be closed as shown in FIGS. 1b and 1c in order to provide a closed, environmentally sealed processing chamber having a volume that is sufficiently small to substantially avoid thermal convection currents that might otherwise arise during baking and chilling. Environmental sealing also protects the processing chamber and its contents from contaminants and allows the processing chamber to be more effectively purged with a gas (if it is desired to carry out processing in a special atmosphere) or evacuated (if it is desired to carry out processing in a vacuum or a partial vacuum), as desired.

Housing 14 contains a relatively low thermal mass, thermally conductive heating member in the form of bakeplate 20 and a relatively high thermal mass heat sink in the form of cooling member 26. As used herein, "low thermal mass" means that the thermal capacity of bakeplate 20 is, at most, about the same order of magnitude as the thermal capacity of the workpiece being processed. Preferably, the ratio of the thermal capacity of bakeplate 20 to the workpiece is in the range from about 1:100 to about 5:1, preferably 1:10 to about 2:1. As used herein, "high thermal mass" means that the thermal capacity of cooling member 26 is at least about an order of magnitude greater than that of either bakeplate 20 or the workpiece. Preferably, the ratio of the thermal capacity of cooling member 26 to that of either bakeplate 20 and/or the workpiece is at least 10:1 and more preferably is 10:1 to 100:1, more preferably 30:1 to 50:1. "Thermal capacity" refers to the amount of energy required to raise the temperature of a body by 1° C. For example, thermal capacity, Q, for solid bodies such as wafer 12, bakeplate 20, and cooling member 26 may be represented by the formula $$Q = Mc_p$$

wherein M is the mass of the body in kg and $C_p$ is the average heat capacity (J/kg-° C.) of the body over the desired temperature range.

Bakeplate 20 has a first major surface 22 for supporting semiconductor device 12 such that heat energy from bakeplate 20 can be transferred to semiconductor device 12 during baking. Bakeplate 20 also includes second major surface 24 which can be placed into thermal contact with cooling member 26. "Thermal contact" means that bakeplate 20 and cooling member 26 are in sufficiently close proximity such that cooling effects of cooling member 26 can be imparted to semiconductor device 12 through bakeplate 20. The most rapid cooling occurs when second major surface 24 is in direct physical contact with cooling member 26 as shown in FIG. 1c. However, effective cooling can still occur even when there is some physical separation, e.g., up to about 3 mm in preferred embodiments, between bakeplate 20 and cooling member 26.

Bakeplate 20 includes heating zone 25 that preferably is in the form of a resistive heating element (not specifically shown) of the type in which the amount of electrical energy supplied to the heating zone 25 by electrical connects 36 is converted into a corresponding amount of thermal energy. Because bakeplate 20 has relatively low thermal mass and is thermally conductive, heat energy released in bakeplate 20 is quickly transferred to semiconductor device 12.

In terms of surface area, heating zone 25 is preferably larger than semiconductor device 12 to ensure that heating zone 25 not only underlies wafer 12, but also extends beyond edge 13 of wafer 12 as well. If heating zone 25 were to be smaller than semiconductor device 12, nonuniform heating of wafer 12 could likely result. More preferably, in embodiments of apparatus 10 including a frame member such as annular member 40, heating zone 25 desirably is large enough to not only underlie wafer 12, but also at least the substantial entirety of annular member 40. In this way, extremely uniform heating of semiconductor device 12 is achieved. For example, as shown in FIGS. 1a, 1b, and 1c, the surface area of heating zone 25 is substantially the same size as the combined surface area of both wafer 12 and annular member 40.

Cooling member 26 has relatively high thermal mass as compared to semiconductor device 12 and bakeplate 20. Cooling member 26 thus serves as a thermally massive heat sink and can be maintained at any desired cooling temperature effective to provide chilling, e.g., 15° C. to 23° C. being typical. Via thermal conduction, bakeplate 20, and hence wafer 12, are rapidly chilled when bakeplate 20 is placed into thermal contact with cooling member 26. Cooling member 26 includes cooling channels 28 which pass through the interior of cooling member 26. This allows cooling member 26 to be maintained at the desired cooling temperature by circulating chilled cooling media, e.g., water or the like, through cooling channels 28. The chilling media may include an anticorrision agent in order to protect cooling member 26 against corrosion.

In preferred embodiments, cooling member 26 is formed from a corrosion resistant, thermally conductive metal, such as aluminum, stainless steel, copper, combinations of these, or the like. If cooling member 26 is made from copper, the copper preferably includes a coating, such as Ni, that protects the copper from corrosion and also prevents copper ions from contaminating wafer 12. If cooling member 26 is made from aluminum, the aluminum can be passivated with a coating, such as a coating comprising aluminum oxide impregnated with polytetrafluoroethylene or the like, that protects the aluminum against corrosion.

Of course, this embodiment of cooling member 26 is merely preferred, and other kinds of cooling structures and devices can be used instead. For example, instead of using a liquid cooling medium such as water, chilled gases could be used as the cooling medium. The use of a cooling medium, however, is by no means a necessity. For example, cooling member 26 may be a Peltier device. This kind of device does not rely upon a cooling medium to provide cooling, but rather is cooled upon application of electrical energy.

Bakeplate 20 and cooling member 26 are reciprocally moveable relative to each other so that second major surface 24 of bakeplate 20 and top surface 30 of cooling member 26 can be separated or brought together into thermal contact in order to controllably carry out baking and/or chilling. In order to accomplish the most rapid baking of semiconductor device 12, bakeplate 20 and cooling member 26 may be separated by a sufficient distance so that second major surface 24 and top surface 30 are not in thermal contact (see FIG. 1b). When bakeplate 20 and cooling member 26 are separated in this way, virtually little or substantially no cooling effect of cooling member 26 is imparted to bakeplate 20 or semiconductor device 12. In order to achieve the most rapid cooling of semiconductor device 12, second major surface 24 of bakeplate 20 and top surface 30 of cooling member 26 can be placed into physical contact with each other (see FIG. 1c) while no electrical energy is being supplied to heating zone 25. Intermediate rates of cooling and/or baking can be accomplished by adjusting the spacing between cooling member 26 and bakeplate 20 and/or by varying the heat output of bakeplate 20. In some instances, a desirable temperature profile for bakeplate 20 can be achieved by maintaining thermal contact between bakeplate 20 and cooling member 26 while both heating and chilling semiconductor device 12 to some degree at the same time. Indeed, simultaneous heating and cooling is particularly advantageous for maintaining bakeplate 20, and hence wafer 12, at a desired equilibrium temperature (which can be either a baking or chilling equilibrium temperature, as desired) in which the bakeplate equilibrium temperature is controlled to within +/−0.01° C.

Reciprocal relative movement between bakeplate 20 and cooling member 26 may be achieved by using any convenient transport mechanism known in the art. According to one representative technique as shown in FIGS. 1a, 1b, and 1c, bakeplate 20 is supported upon bakeplate posts 32 which can be raised or lowered in order to accomplish corresponding independent movement of bakeplate 20. In a preferred embodiment, bakeplate posts 32 are hollow for housing electrical wiring 36 that transport electrical energy to and from heating zone 25. Advantageously, electrical wiring 36 housed inside hollow bakeplate posts 32 not only is hidden from view for aesthetic purposes, but also is well protected by the walls of bakeplate posts 32. Likewise, cooling member 26 is supported upon cooling member posts 34 that can also be raised or lowered in order to achieve corresponding independent movement of cooling member 26. Posts 32 and 34 can also be actuated at the same time to achieve concerted motion of bakeplate 20 and cooling member 26, if desired.

When supported upon the first major surface 22 of bakeplate 20, semiconductor device 12 is preferably surrounded by a frame member, shown in a preferred configuration for semiconductor processing as annular member 40, which is preferably fixedly secured in any convenient manner to first major surface 22 of bakeplate 20. Annular member 40 has an inner periphery 42 defining an interior space adapted to receive semiconductor device 12 in a manner such that resultant gap 63 between wafer edge 13 and annular member 40 is as small as manufacturing and placement tolerances practically allow. As an example, 1 mm, nominally, is one gap size found to be suitable, since current specifications for wafers allow wafer diameter to vary up to ±1 mm. Also, such a gap is large enough to account for the thermal expansion of a wafer (typically about 0.3 mm) that occurs during baking. Preferably, outer periphery 44 of annular member 40 is covered with insulation (not shown) in order to reduce heat loss and thereby promote uniform heating across the full area of first major surface 22. Preferably such insulation is made from a temperature resistant material such as polyimide, polyamide, or a ceramic that does not degrade during baking operations.

Preferably, annular member 40 is formed from a composition whose thermal diffusivity characteristics are as closely matched as possible to those of the semiconductor device 12 being processed. In the practice of the present invention, thermal diffusivity, α, of a body is given by the expression $$\alpha = k/C_p \rho$$

wherein k is the thermal conductivity of the body, $C_p$ is the specific heat capacity of the body, and ρ is density of the body. In particularly preferred embodiments, the ratio of the thermal diffusivity of the wafer 12 to that of annular member 40 is in the range from 0.8:1 to 1:0.8, more preferably about 1:1. An extremely close match between the thermal diffusivity of annular member 40 and wafer 12 can be achieved when annular member 40 and wafer 12 are formed from the same kind of material as wafer 12. For instance, if wafer 12 were to be formed from at least 80, preferably at least 90, more preferably at least 98, percent by weight of a semiconductive composition such as silicon, germanium, gallium-arsenide, or glass, or the like, then annular member 40 may also be formed from at least 80, preferably at least 90, more preferably at least 98, percent by weight of silicon, germanium, gallium-arsenide, or glass, respectively.

However, semiconductive materials such as these tend to be brittle. Accordingly, where greater robustness or durability are desired, annular member 40 may be formed from a metal alloy or intermetallic composition comprising aluminum, magnesium, and/or stainless steel, of which an aluminum alloy and/or a magnesium alloy are preferred. One aluminum alloy found to be suitable for forming annular member 40 is the type according to industry specification 7075-T6. This aluminum alloy is available from many commercial sources.

Once an appropriate material, or combination of materials, is selected, the thickness of annular member 40 preferably is selected so that the thermal capacities of annular member 40 and wafer 12 have the desired relationship to each other. In preferred embodiments, the thermal capacities of annular member 40 and wafer 12 are substantially identical to each other in order to optimize the uniform heating characteristics of bakeplate 20. In embodiments of the invention in which semiconductor device 12 is based upon a silicon wafer and annular member 40 is made from an aluminum alloy, this objective is achieved when the wafer has a thickness of about 0.76 mm and annular member 40 has a thickness of about 0.66 mm.

Even when using bakeplate 20 in combination with annular member 40, the temperature of semiconductor device 12 may still not be as uniform as desired across the surface of wafer 12 during baking and/or chilling. Specifically, during a temperature ramp period, portions of wafer 12 proximal to edge 13 tend to "lead" interior portions of wafer 12. That is, during baking ramps, edges 13 tend to be somewhat hotter than interior portions of wafer 12, and during chilling ramps or at equilibrium, edges 13 tend to be somewhat cooler. To compensate for such temperature edge effects, bakeplate 20 advantageously may incorporate two independent heating zones including at least a first inner heating zone portion underlying at least the interior portion of wafer 12 and a second outer, annular shaped heating zone portion underlying at least portions of annular member 40. The boundary between the two heating zones can be placed under annular member 40, under wafer 12, and/or under gap 63, as desired.

Such first and second heating zone portions preferably would be independently controllable so that the temperature profile across the diameter of semiconductor device 12 can be made more uniform by independently adjusting the heat output of each zone portion. Thus, if temperature edge effects were to be observed, the second heating zone portion could be adjusted to output a lower or higher amount of heating energy, as appropriate, relative to the first heating zone portion in order to reduce, and preferably eliminate, such effects. The different heating zones may, if desired, be controlled by separate heater controllers. Alternatively, the zones may share a common controller that controls the zones so that their respective heat outputs can be controlled in the desired manner.

The wafer-supporting, first major surface 22 of bakeplate 20 preferably includes a plurality of protuberances 56 that minimize the direct physical contact area, and help ensure a consistently-sized gap 62, between bakeplate 20 and semiconductor device 12. In accordance with conventional practices, protuberances 56 are of uniform height and typically have a height in the range from 10 micrometers to 300 micrometers, preferably 50 micrometers to 200 micrometers. Each individual protuberance 56 typically may have a cross-sectional, workpiece supporting area in the range from 0.01 $mm^2$ to about 6 $mm^2$. Protuberances 56 may be formed with a wide variety of shapes, including, for example, a rectilinear shape with a flat top surface, a cylindrical shape with a flat top surface, a spherical or ellipsoidal shape, a hollow tubular shape in which the axes of the tubes are generally perpendicular to the plane of surface 22 such that only the wall edges of the tubular-shaped protuberances 56 contact semiconductor device 12, combinations of these, or the like.

Protuberances 56 may be formed from any dimensionally stable, durable material that preferably does not scratch wafer 12. For example, protuberances 56 may be formed from any polymer, metal, ceramic, or combination thereof. Temperature resistant polymers such as polyamide or polyimide are presently preferred. Protuberances 56 can be formed using any suitable technique, including physical placement, etching, sputter deposition, chemical vapor deposition, spraying through an appropriate mask, screenprinting, and the like.

Figure 1D:
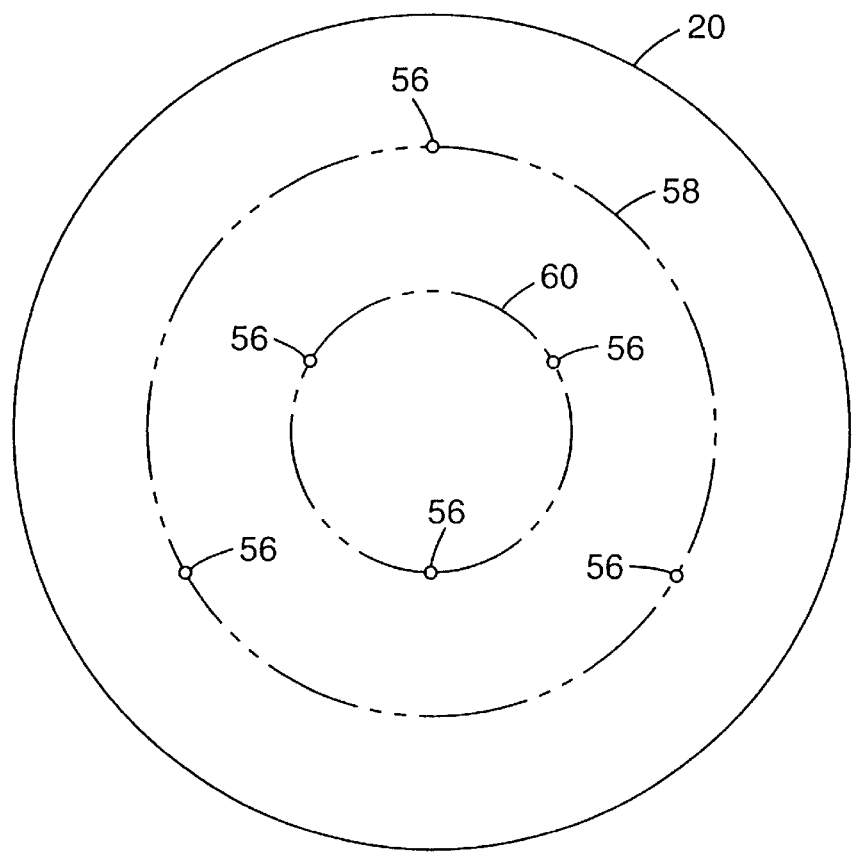
FIG. 1d is a top view of a bakeplate of the present invention illustrating a preferred arrangement of wafer-supporting protuberances.

Preferably, protuberances 56 are provided with density distribution characteristics effective to provide a contact area between semiconductor device 12 and bakeplate 20 that is 1%, preferably less than 0.1% of the area of first major surface 22 underlying semiconductor device 12. According to one specific example of a protuberance distribution as shown in FIG. 1*d*, six tubular protuberances 56 having a height of 150 micrometers, an outside diameter of about 1.6 mm, and an inside diameter of about 0.8 mm are arranged in two triangular patterns positioned at two different radii 58 and 60 from the center of bakeplate 20. With this approach, the total contact area between semiconductor device 12 and bakeplate 20 is so small as to be negligible, yet semiconductor device 12 (and annular member 40 if present) is adequately supported. As another example, a large number of protuberances 56 can be formed in an array over the entire surface 22, e.g., as a triangular pattern in which adjacent protuberances 56 are about 4 mm to 6 mm apart. In such an array, individual protuberances 56 are typically 0.1 mm to 0.5 mm, preferably about 0.2 mm to 0.3 mm, in diameter.

Bakeplate 20 may optionally be provided with one or more flow channels 38 in order to provide fluid communication gap 62 between bakeplate 20 and semiconductor device 12. Gap 62 may be filled with a gas such as ordinary air or a more conductive gas if it is desired to enhance the thermal conductivity between bakeplate 20 and semiconductor device 12. For example, helium gas is approximately seven times more conductive than air. Introducing a gas into gap 62 might also help reduce the tendency of semiconductor device edge 13 to overheat relative to other portions of semiconductor device 12. Alternatively, in the presence of an appropriate seal between semiconductor device 12 and bakeplate 20, gap 62 may be used to pull a slight vacuum, e.g., a vacuum on the order of 3000 Pa to 14,000 Pa, against wafer 12 in order to help hold wafer 12 in position. For example, an annular shaped protuberance (not shown) could be provided on bakeplate 20 proximal to edge 13 to help form such a seal.

Still referring to FIGS. 1*a*, 1*b*, and 1*c*, the temperature of semiconductor device 12 is desirably monitored directly or indirectly during baking and chilling operations so that the heat output of bakeplate 20 can be controlled using a suitable feedback control methodology, such as PID control. According to the direct approach for monitoring wafer temperature, a suitable temperature sensor (not shown) can be attached directly to semiconductor device 12. However, for high volume production applications, this approach is not really practical or desirable, because the direct approach requires the additional processing steps of attaching and detaching temperature sensor(s) to a semiconductor device every time a new semiconductor device is to be inserted into apparatus 10 for processing. Additionally, wafers typically support sensitive componentry that could be adversely affected by contact with a temperature sensor.

Accordingly, it is much more desirable to monitor the temperature of semiconductor device 12 indirectly by attaching a suitable temperature sensor to annular member 40, particularly when the thermal capacity of annular member 40 is matched to that of wafer 12 as discussed above. Under such circumstances, the actual temperature of the top surface of semiconductor device 12 substantially corresponds to the temperature of the top surface of annular member 40 at substantially all times during baking and/or chilling, even during temperature ramps. Indeed, the difference in temperature between the top surface of annular member 40 and the top surface of semiconductor device 12 is substantially constant and more preferably negligible, as a practical matter. Accordingly, when indirectly monitoring the temperature of the top surface of semiconductor device 12 using a temperature sensor coupled to the top surface of annular member 40, a simple correction, if needed, can be applied to the measured temperature in order to account for the temperature difference, if any, between the top surfaces of semiconductor device 12 and annular member 40.

The temperature sensor to be used in the present invention may be any suitable temperature sensor that is capable of sensing temperature at rapid intervals with stability and consistency over long periods of time. A variety of suitable temperature sensing devices are known of which a resistive thin-film (RTD) sensor is most preferred. Several suitable types are available from a variety of commercial sources. As one example, a suitable thin-film RTD sensor is commercially available under the trade designation 517422 PDX40A from Minco Products, Inc., Minneapolis, Minn. This sensor incorporates a platinum wire having a diameter of about 50 micrometers encased in a "KAPTON" brand polyamide resin layer having a thickness of about 100 micrometers (i.e., the encased wire has an overall diameter of about 250 micrometers). The RTD sensor may be bonded into the desired position using a suitable temperature resistant adhesive such as a polyamide resin, a polyimide resin, a polyimideamide resin, a silicone resin, an epoxy resin, microtextured polytetrafluoroethylene, combinations of these, or the like.

As an alternative to buying an RTD temperature sensor, an RTD temperature sensor may be constructed in situ, or constructed in-house and then subsequently bonded into position, from an electroresistive material with RTD characteristics using any suitable formation technique known in the art such as a sputter-etching process. For example, to form an RTD sensor in situ, a layer of a suitable electroresistive metal such as platinum may be deposited at the desired position and then etched to form an RTD temperature sensor. A layer of insulation is desirably deposited between the sensor and the component to which the sensor is attached. The layer of insulation may comprise any insulating material of the type conventionally used in the microelectronics industry, including polytetrafluoroethylene, polyamide, polyimide, polyamideimide, silicon dioxide, silicon nitride, combinations of these, and the like.

In some applications, an RTD sensor used by itself may not have the requisite agility needed to provide meaningful control of wafer temperature. In those situations, a particularly preferred temperature sensor is a hybrid sensor system including a combination of a relatively slow and stable first temperature sensing device (preferably an RTD sensor) and a relatively fast and unstable second sensor device (preferably a thermocouple). The fast/unstable second sensor device is used to sense temperature of wafer 12 with greater speed, while temperature measurements sensed by the slow/stable first sensor device are used to calibrate the second sensor automatically on-line so that the second sensor measurements remain accurate and reliable over time.

The concept of using the hybrid temperature sensor is based upon the appreciation that thermocouples can sense temperature at rates as fast as 1000 to 2000 Hz, yet tend to have relatively poor temperature sensing stability over time. On the other hand, although a typical RTD temperature sensor might have a lower sensing speed, e.g., temperature sensing capabilities of only up to about 10 Hz, RTD sensors generally have excellent temperature sensing stability over long periods of time. Thus, by using the RTD sensor to calibrate the thermocouple automatically on-line, the hybrid sensor system obtains the benefits of both kinds of sensing devices while eliminating their individual drawbacks. In embodiments of the invention in which a hybrid device incorporating a thermocouple is used, the thermocouple may be bonded into position using an adhesive as described above with respect to RTD sensors.

When using a hybrid temperature sensor, calibration of the thermocouple using signals from the RTD sensor preferably is performed repeatedly and automatically on an ongoing basis. In this way, the temperature data sensed by the thermocouple always will substantially correspond to the more stable temperature data sensed by the RTD sensor. The type of calibration methodology used is not critical, and any conventional calibration methodology may be used. Calibration methodologies for calibrating temperature sensors are known and generally described, for example, in U.S. Pat. Nos. 5,495,093; 5,475,610; 5,460,709; 4,941,308; and 4,480,312.

FIGS. 1a, 1b, and 1c schematically illustrate three configurations of apparatus 10 that are particularly illustrative of how baking and chilling may be carried out. FIG. 1a shows apparatus 10 in a "ready" configuration in which housing 14 is open, allowing semiconductor device 12 to be inserted into apparatus 10 and placed onto stationary support pins 19. Bakeplate 20 is initially in a preferred "idle" position resting atop cooling member 26.

FIG. 1b shows a second configuration of apparatus 10 in which the baking cycle has been initiated by lifting bakeplate 20 free of cooling member 26 in order to thermally decouple second major surface 24 of bakeplate 20 from cooling member 26. In this configuration, the first major surface 22 of bakeplate 20 is lifted at least flush with support pins 19, or perhaps higher if desired, so that semiconductor device 12 has been brought into thermal contact with first major surface 22 of bakeplate 20. Semiconductor device 12 may be held in place on top of bakeplate 20 using a light vacuum, if desired. In embodiments of the invention in which heating zone 25 is provided by an electrically resistive heater, heating can be accomplished by transmitting electric current through heating zone 25 in a manner effective to provide the desired baking profile.

FIG. 1c shows a configuration of apparatus 10 effective to accomplish rapid chilling. In this configuration, cooling member 26 is raised until it is in thermal contact with second major surface 24 of bakeplate 20. Cooling effects of cooling member 26 are now imparted to semiconductor device 12 via conduction through bakeplate 12. The most rapid chilling rates can be achieved by completely turning off heating zone 25 during chilling, but less drastic temperature descents can be achieved by merely adjusting the heat output of heating zone 25. The configuration of FIG. 1c can also be used to achieve relatively slow baking rates by increasing the heat output of heating zone 25 until the chilling effect of cooling member 26 is overcome sufficiently such that the desired baking rate is achieved. Bakeplate 20 and semiconductor device 12 may be thermally decoupled from cooling member 26 when chilling is complete. Thermal decoupling is best accomplished by separating bakeplate 20 and cooling member 26 to achieve the configuration of FIG. 1b. As an alternative, bakeplate 20 and cooling member 26 can remain coupled while a relatively small, but sufficient amount of energy is supplied to heater zone 25 so as to maintain wafer 12 at the desired chill equilibrium temperature.

Figure 2A:
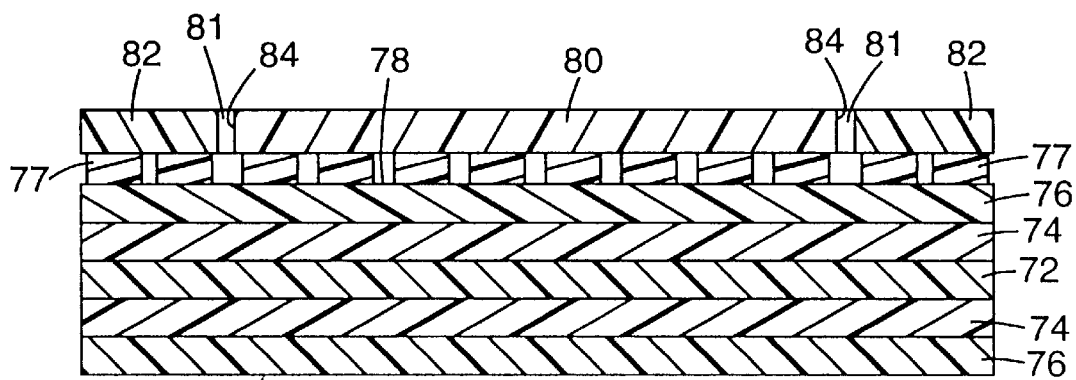
FIG. 2a is a cross sectional view of a bakeplate embodiment of the present invention showing a preferred laminate construction.
Figure 2B:
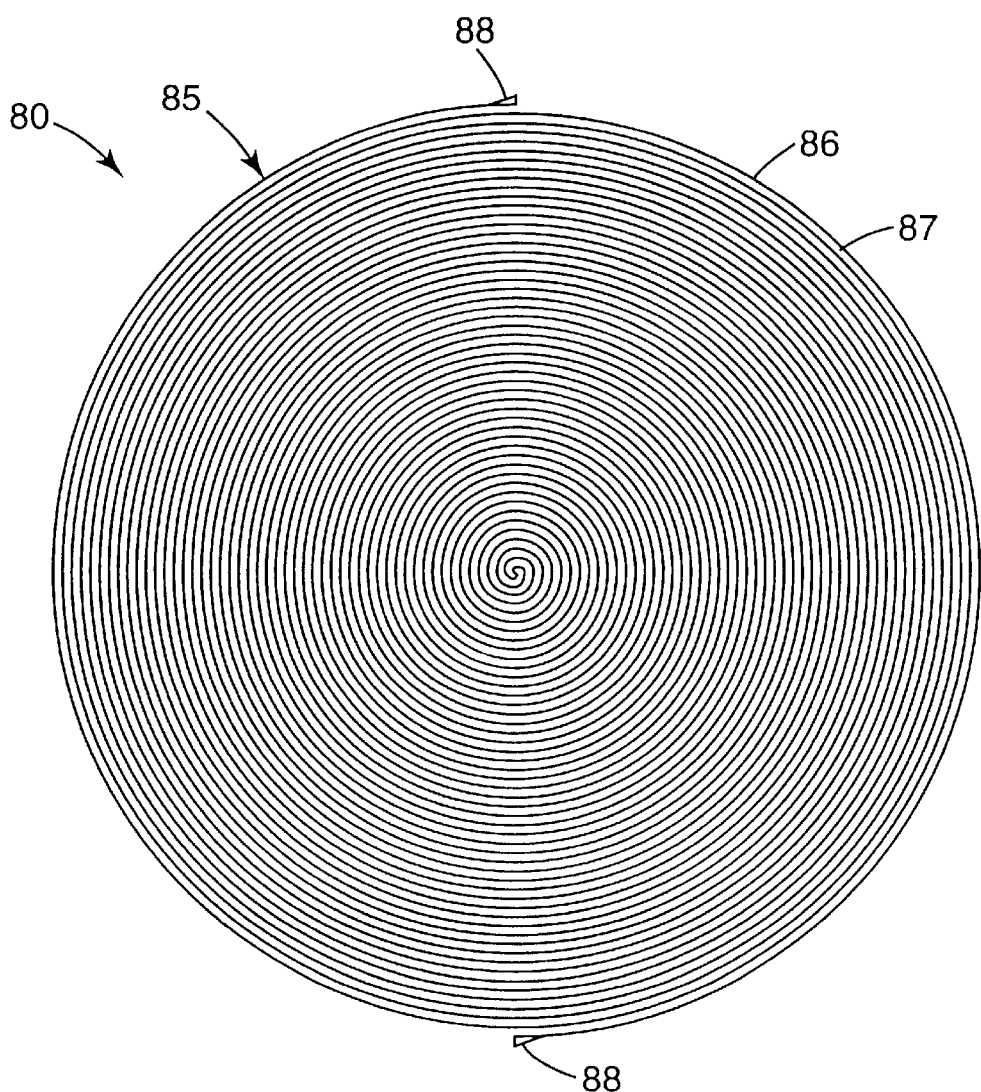

A particularly preferred embodiment of a laminated bakeplate 70 of the present invention is shown in FIGS. 2a and 2b. Bakeplate 70 includes centrally positioned heater ply 72 sandwiched between dielectric layers 74 and structural substrates 76 symmetrically positioned on each side of heater ply 72. Protuberances 77 are provided on one surface 78 of bakeplate 70 for supporting wafer 80 and annular member 82. Protuberances 77 correspond to protuberances 56 of FIGS. 1a, 1b, and 1c. Thus, protuberances 77 may have any of the same composition, structure, size, and distribution characteristics as protuberances 56. In FIG. 2a, a cross-section of bakeplate 70, thicknesses of individual laminated layers 72, 74, 76, and 77 making up bakeplate 70 are not drawn to scale and have been exaggerated for purposes of illustration. Actual representative ranges of suitable thicknesses for these layers will be described below.

The symmetrical, sandwich structure of bakeplate 70 provides numerous benefits. Firstly, because the various layers 72, 74, and 76 tend to be formed from materials characterized by coefficients of thermal expansion that are dissimilar to each other over the full temperature range of typical baking and chilling operations, stresses may develop between layers 72, 74, 76, and 77 upon changes in temperature. Such stresses could cause a nonsymmetrical laminated structure to distort. However, because of the symmetry of bakeplate 70 about centrally positioned heater ply 72, these stresses are balanced in bakeplate 70. As a consequence, the ability of bakeplate 70 to remain flat during temperature change is improved relative to laminated bakeplate structures lacking such symmetry. As another advantage, because structural substrates 76 are on the outside of bakeplate 70 and heater ply 72 is well-protected on the inside of the structure, bakeplate 70 can be planarized using economical, effective lapping techniques after the various layers are laminated together. Because each substrate 76 may lose 25 micrometers to 200 micrometers thickness due to lapping, bakeplate 70 at the outset could be formed from substrates 76 having enough extra thickness to accommodate such material removal.

Referring collectively to FIGS. 2a and 2b, heater ply 72 preferably comprises electrically conductive pathway 86 defining circular heating zone 85. Electricity is transported to and from heating zone 85 via electrical connects 88. Electricity conducted along electrically conductive pathway 86 is converted into thermal energy for heating wafer 80. The amount of heat generated by heating zone 85 correlates to the voltage of the electrical energy supplied to heating zone 85. Generally using greater amounts of electrical energy tends to generate more heating. In preferred embodiments, for example, the heat output of heating zone 85 is proportional to the square of such voltage.

Electrically conductive pathway 86 traverses heating zone 85 with a sufficient pathway density such that heater ply 72 is capable of uniformly heating wafer 80. In actual practice, each turn of electrically conductive pathway 86 typically is 0.2 mm to 2 mm wide, and gap 87 between adjacent turns of electrically conductive pathway 86 is typically 0.2 mm to 2 mm wide. In the preferred form as shown in FIG. 2b, electrically conductive pathway 86 is in the form of a double spiral. Other configurations can be used. For example, pathway 86 can traverse heating zone 85 in rectilinear fashion if desired.

Heating zone 85 can be formed in a variety of ways. According to one approach, heater zone 85 is formed from an electrically conductive material that is initially present as a continuous layer. Heater zone 85 may then be formed by precision etching the continuous layer using any conventional etching technique. Suitable electrically conductive materials for forming heater zone 85 include metals such as copper; a Ni—Cr containing alloy such as the Ni—Cr—Co alloy available under the trade designation "INCONEL" from Inco Alloys International, Ltd. of Canada; or the "KOVAR" Ni—Cr—Co alloy available from the Ed Fagan Company, Franklin Lakes, N.J.; platinum; combinations of these; and the like. Heating zone 85 may have any suitable thickness for accomplishing electrically resistive heating of a type contemplated by this invention. For example, forming heating zone 85 from a copper foil having a thickness of 17.8 microns (0.0007 inches) commonly referred to as "½ ounce copper foil" has been found to be suitable.

In one mode of practicing the present invention, heater ply 72 and one of the dielectric layers 74 may be formed collectively from a copper clad polyimide commercially available from E.I. DuPont de Nemours and Company under the tradename "PYRALUX". In "single-sided" form, this particular composite structure generally includes a very lightweight, copper foil laminated to a somewhat thicker polyamide layer. The lightweight, copper foil layer can be etched to form heater ply 72, while the polyamide layer serves as one dielectric layer 74. This product can also be purchased in "double-sided" form in which the polyamide layer sandwiched between two outer foil layers.

Referring again primarily to FIG. 2a, dielectric layers 74 sandwich heater ply 72 in order to electrically insulate heater ply 72 from substrates 76, wafer 80, annular member 82, and any other elements of the surrounding environment. Dielectric layers 74 also function as adhesive layers laminating heater ply 72 to substrates 76. Preferably each layer 74 has a thickness in the range from 10 micrometers to 30 micrometers and may be formed from any of the dielectric materials conventionally used in the microelectronics industry. Representative examples of suitable dielectric materials include inorganic dielectrics such as silicon dioxide, silicon nitride, and a substantially alkaline-free vitrified porcelain frit; temperature resistant polymers such as polytetrafluoroethylene, polyamide, polyimide, polyamideimide; any other electrically insulative material that retains electrically insulative characteristics over the temperature ranges associated with baking and chilling; combinations of these; and the like.

For operations involving temperatures above about 300° C., electrically insulative materials such as silicon dioxide, silicon nitride, substantially alkaline-free, vitrified porcelain frits, or the like are preferred. Polyamide resins are more preferred materials for forming dielectric layers for use in operations occurring at temperatures below about 300° C., however. Advantageously, polyamide resins not only generally have excellent adhesive and dielectric properties, but also are also economical to obtain and easy to incorporate into laminate structures. Polyamide resins also generally tend to be flexible so that bakeplate 70 incorporating such polyamide materials could have conformability characteristics, if desired. A specific example of a polyamide found to be useful in the present invention is available in sheet form as EKJ polyamide thermoset adhesive from E.I. duPont de Nemours & Co.

Each substrate 76 serves as a structural ply to support and protect the other layers of bakeplate 70. Substrates 76 also facilitate both lateral and vertical heat conduction through bakeplate 70 to promote uniform heating of a semiconductor device 80 and annular member 82 supported upon bakeplate 70. Accordingly, each substrate 76 independently generally is made from a suitable structural material, or combination of materials, that can structurally support the other layers of bakeplate 70 as well as withstand the temperature changes of baking and chilling operations without distortion, sagging, wrinkling, loss of tension, or other undesirable degradation.

Representative examples of materials that could be used to form each substrate 76 include metal compositions such as copper, stainless steel, high strength alloy steel, a Ni—Cr containing alloy such as the "INCONEL" and "KOVAR" Ni—Cr—Co alloys discussed above (the "KOVAR" alloy is more preferred, because the "KOVAR" alloy has a thermal expansion coefficient that is more similar to that of silicon in the typical temperature ranges involved in many baking and chilling operations), aluminum, combinations of these, and the like. When copper is used, the copper is preferably nickel-plated on both sides to prevent wafer 80 from being contaminated with copper ions. For instance, a flash coating of nickel having a thickness in the range from 100 angstroms to 1000 angstroms would be suitable for this purpose.

Other suitable materials for forming each substrate 76 include nonmetallic, inorganic materials such as single crystal or polycrystalline silicon, silicon carbide, graphite, glass, diamond, and the like. Substrates 76 also may be advantageously formed from composite materials such as diamond composites, a metal-clad polymer, metal-filled ceramics, ceramic-filled metals, combinations of these, and the like. Examples of metal/ceramic composites for use as a substrate 76 include sheet products including a thermal pyrolytic graphite ("TPG") composite encased within a structural shell of metal and/or a metal-ceramic composite. Such sheet products are commercially available under the TC1050 and TC500 trade designations from Advanced Ceramics Corporation, Lakewood, Ohio.

In terms of thickness, each substrate 76 should be thin enough so that each substrate 76 has a relatively low thermal mass to allow cooling and heating effects to be rapidly imparted to wafer 80. However, if substrate 76 is too thin, the mechanical strength and durability of bakeplate 70 may be poor, resulting in a relatively short service life. Lateral conductivity, and hence heating uniformity, also decrease with decreasing substrate thickness. On the other hand, a thicker substrate 76 would tend to have better lateral thermal conductivity properties and, thus would tend to provide more uniform heating of a wafer supported on bakeplate 70. Thicker substrates 72 are also advantageous in that they have a relatively large thermal mass at gap 81 between semiconductor device 80 and annular member 82 that further help promote uniform heating at wafer edge 84. However, if substrate 76 were to be too thick, substrate 76 would have more thermal mass, slowing down the rate at which wafer 80 could be heated and cooled.

Balancing these concerns, each substrate 76 preferably is provided with a thickness in the range from 20 micrometers to 3 mm. In a particularly preferred embodiment of bakeplate 70, each substrate 76 is formed from aluminum having a prelapping thickness of 1 mm, each dielectric layer 74 is formed from polyamide having a thickness of about 50 micrometers, and heater ply 72 is an etched copper foil having a thickness of about 25 micrometers.

According to one approach for forming bakeplate 70, the individual layers to be laminated together are registrably stacked together. Locating pins (not shown) may be registrably positioned through the stacked layers to help achieve proper alignment as the layers are stacked together. The stack of layers is then placed into a vacuum bag between flat, steel caul plates. A vacuum is drawn, the caul plates are pressed together at a pressure of 350 psi (24 bars), and the clamped assembly is heated at 350° C. for a time (typically 2 to 24 hours) sufficient to effectively bond the layers together.

Figure 3:
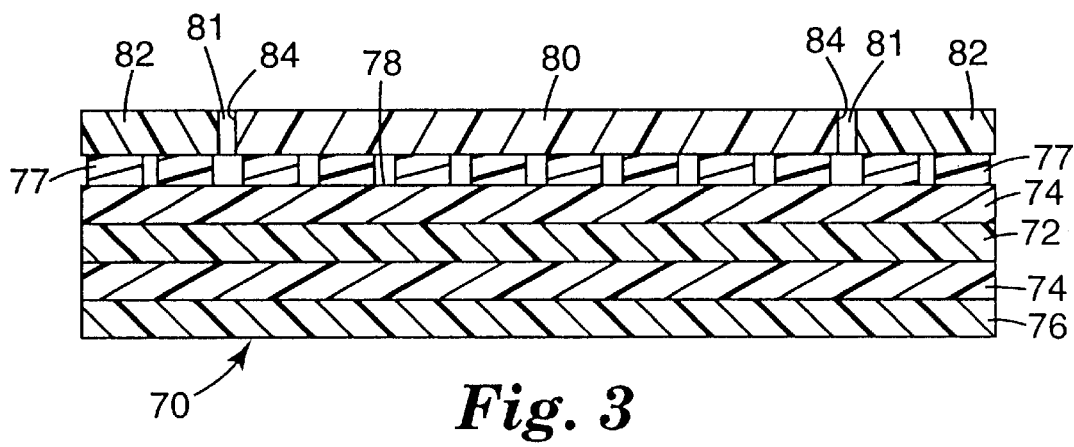
FIG. 3 is a cross sectional view of an alternative embodiment of a bakeplate of the present invention showing another laminate construction.

FIG. 3 shows an alternative embodiment of a laminated bakeplate 70 of the present invention. Generally, bakeplate 70 of FIG. 3 is similar to bakeplate 70 of FIG. 2a, except that layers 72, 74, 76, and 77 of FIG. 3 are laminated to each other in a different sequence. Further, bakeplate 70 of FIG.

3 includes only a single structural substrate 76. Specifically, bakeplate 70 of FIG. 3 is a laminate structure formed from, in order, a laminated sequence of layers including structural substrate 76, dielectric layer 74, heater ply 72, a second dielectic layer 74, and finally protuberances 77. Otherwise, layers 72, 74, 76, and 77 of FIG. 3 are the same as the corresponding layers of FIG. 2a.

Advantageously, with the configuration shown in FIG. 3, substrate 76, which tends to be the most thermally massive component of bakeplate 70, is at the bottom of the laminate structure. Thus, substrate 76 will be in closest proximity to cooling member 26 (see FIGS. 1a, 1b, 1c) during chilling operations. This proximity allows cooling member 26 to draw heat out from substrate 76 faster than if substrate 76 were to be at another location in the laminate. In short, cooling of bakeplate 72 is generally extremely rapid when substrate 76 is in the bottom location shown in FIG. 3.

Figure 4:
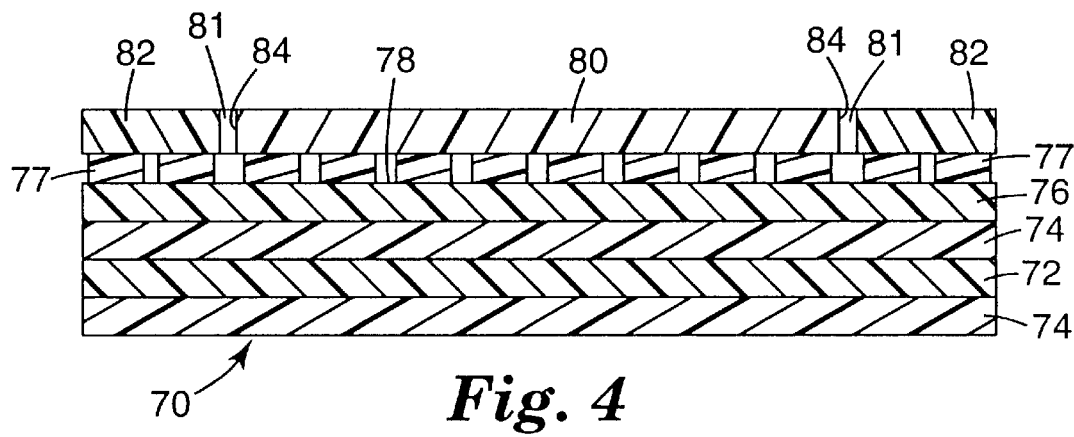
FIG. 4 is a cross sectional view of an alternative embodiment of a bakeplate of the present invention showing another laminate construction.

FIG. 4 shows another alternative embodiment of a bakeplate 70 of the present invention. Generally, bakeplate 70 of FIG. 4 is similar to bakeplate 70 of FIG. 3, except that layers 72, 74, 76, and 77 of FIG. 4 are laminated to each other in a different sequence. Specifically, bakeplate 70 of FIG. 4 is a laminate structure formed from, in order, a laminated sequence of layers including a first dielectric layer 74, heater ply 72, a second dielectric layer 74, structural substrate 76, and finally protuberances 77. Otherwise, layers 72, 74, 76, and 77 of FIG. 4 are the same as the corresponding layers of FIG. 3.

In some embodiments, any of the substrates of FIGS. 2a, 3, and/or 4 incorporated into any of bakeplates 70 described above may not be inherently self-supporting. Generally, this tends to be the case when any such substrate is relatively thin, e.g., characterized by a thickness in the range 25 micrometers to about 0.2 mm. Such relatively thin substrates are desirably radially tensioned beyond yielding and then maintained in such radial tension when a the layers of a laminated bakeplate incorporating the tensioned sheet(s) are assembled. The tension may be maintained by attaching the tensioned sheet(s) to a suitable frame member, which may be annular member 82, another hoop-shaped frame, or the like. Such thinner sheets also are desirably formed from a material having a sufficiently low coefficient of thermal expansion within a typical baking and chilling temperature range, e.g. 0° C. to 350° C., so that an acceptable level of tension is maintained in substrate 76 throughout baking and chilling operations. For example, the commercially available Ni—Cr—Co alloys available under the trade designations INCONEL and KOVAR would be suitable for forming a radial tensioned substrate of the present invention. A radially tensioned substrate of the present invention preferably may be fashioned from sheet metal that is desirably as isotropic as possible in terms of modulus of elasticity and thickness characteristics.

Figure 5A:
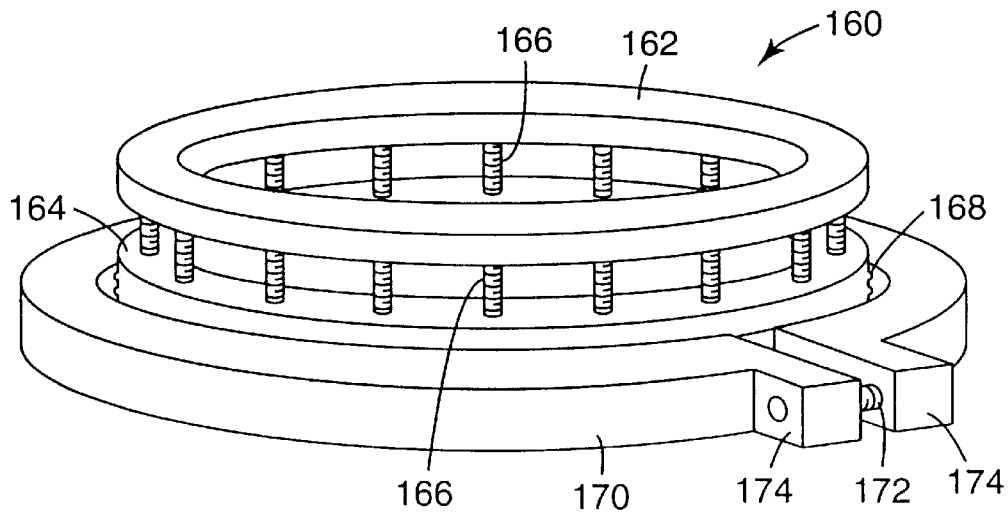
FIG. 5a is a perspective view of one embodiment of a radial tensioning apparatus suitable for radially tensioning bakeplate substrates of the present invention.
Figure 5B:
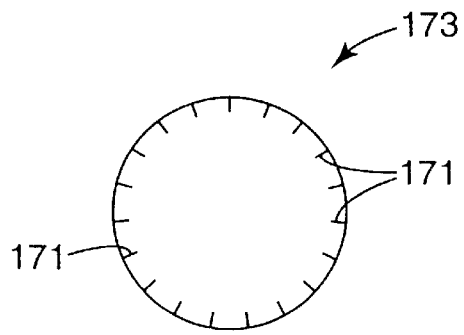
Figure 5C:
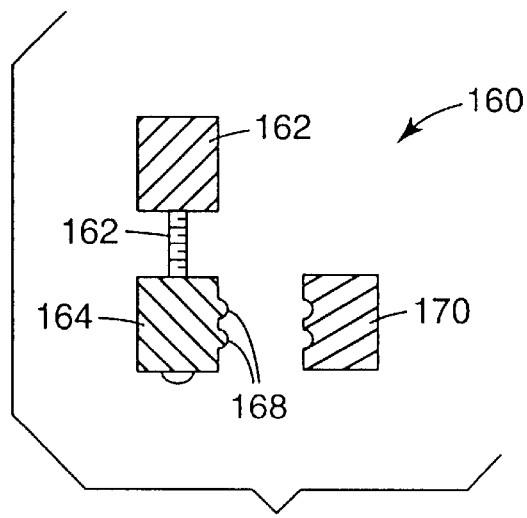

FIGS. 5a, 5b, and 5c illustrate one embodiment of a radial tensioning apparatus 160 suitable for applying radial tension to a substrate 173 of the type corresponding to substrate 76 used in any of FIGS. 2a, 3, and/or 4. Radial tensioning apparatus 160 includes lop hoop 162 and bottom hoop 164 coupled to top hoop 162 by screws 166. The distance between top hoop 162 and bottom hoop 164 can be adjusted by adjustment of screws 166. Peripheral ridges 168 are located on the outside of bottom hoop 164 and cooperate with hoop clamp 170 to secure substrate 173 in position over radial tensioning apparatus 160. Hoop clamp 170 is adjustable so that it can be tightened or loosened around the outside of bottom hoop 164 merely by adjusting tightening screw 172. Turning tightening screw 172 in one direction draws flanges 174 together to tighten hoop clamp 170 and thereby provide clamping force against bottom hoop 164. Alternatively, turning tightening screw 172 in the other direction spreads flanges 174 apart, thus loosening hoop clamp 170 to relieve clamping pressure against bottom hoop 164.

In a preferred mode of operation, top hoop 162 and bottom 164 are adjusted to that the separation between the two hoops is at a minimum. An oversized substrate 173 is then draped over top hoop 162 and bottom hoop 164. The substrate 173 should be large enough so that peripheral portions of the substrate 173 lie against the outside surface of bottom hoop 164 over peripheral ridges 168. In some instances, it may be difficult to drape the substrate 173 in this way. If so, then as shown in FIG. 5c, a plurality of radial cuts 171 can be made at the outer periphery of substrate 173 to facilitate fitting substrate 173 over hoops 162 and 164, if desired. Hoop clamp 170 is then tightened around bottom hoop 164 in order to secure the substrate 173 in place. Screws 166 may then be adjusted to increase the separation between top hoop 162 and bottom hoop 164, thereby placing substrate 161 under radial tension. Preferably, the substrate 173 is tensioned beyond its yield point.

While substrate 173 is under radial tension, a suitable hoop-shaped frame (not shown) may be bonded or otherwise attached to substrate 173 in order to preserve radial tension in substrate 173 after substrate 173 is removed from apparatus 160. After the frame is bonded to substrate 173, excess portions of the substrate 173 located outside the periphery of the annular member may then be trimmed away. Other plies of the bakeplate incorporating, the tensioned substrate 173 may be formed on substrate 173 either before or after radial tensioning, as desired.

Figure 6:
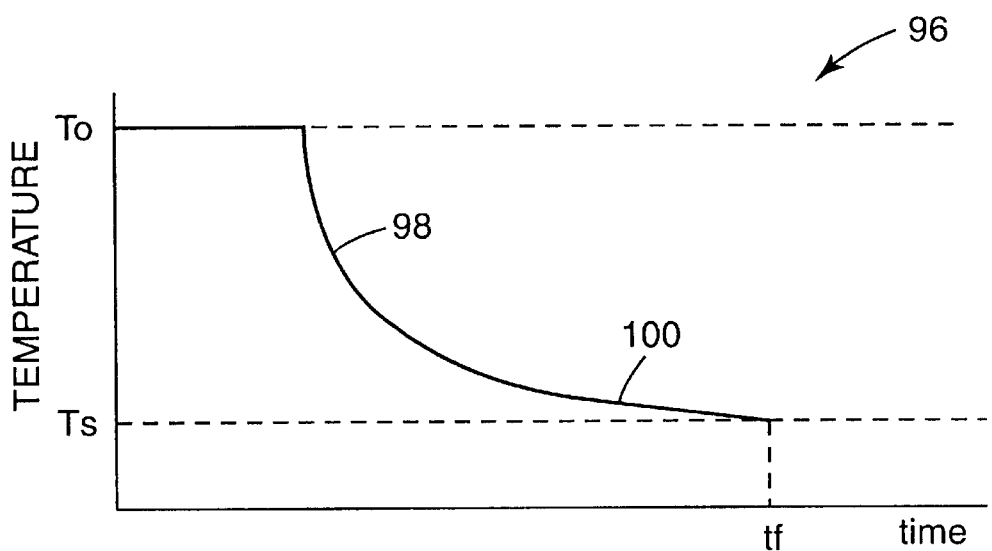
FIG. 6 is a temperature profile of a semiconductor device that is being chilled with a chill plate that is maintained at the same temperature as the desired final chill dwell temperature.
Figure 7:
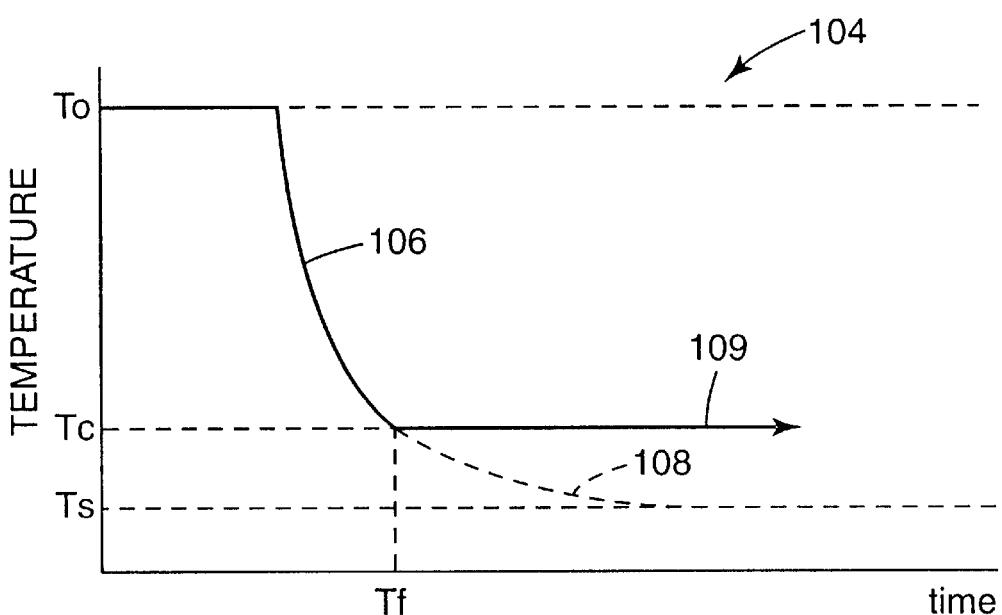
FIG. 7 is a temperature profile of a semiconductor device that is being chilled with a chill plate that is maintained at a temperature below the final desired chill equilibrium temperature.

The chilling characteristics of apparatus 10 illustrated in FIGS. 1a, 1b, and 1c will now be further explained with respect to the temperature profiles of FIGS. 6 and 7. In one approach, cooling member 26 may be maintained at a temperature, $T_c$, to which semiconductor device 12 is to be cooled. FIG. 6 shows a temperature profile 96 of a typical semiconductor device 12 during chilling when using such an approach. Initially, semiconductor device 12 is at an initial temperature $T_o$ and then asymptotically approaches and substantially reaches the final temperature $T_c$ after a time $t_f$. As illustrated in FIG. 6, this conventional approach results in rapid initial chilling of semiconductor device 12 in region 98 when the difference between the semiconductor device temperature and $T_s$ is relatively large. However, as shown by region 100, the chill rate slows down exponentially as the device temperature approaches $T_c$. In fact, with the approach shown in FIG. 6, over 50% of the chill time can be spent in getting the last 2% to 3% of heat out of semiconductor device 12.

Of course, the chilling approach of FIG. 6 may be used in the practice of the present invention if desired. However, to avoid the inefficiencies of the FIG. 6 approach, the present invention preferably uses a more preferred "chill boost" method of chilling semiconductor device 12. According to the chill boost approach, shown in FIG. 7, cooling member 26 is maintained at a temperature $T_s$ less than $T_c$, and the device temperature is dynamically monitored during chilling so that chilling can be stopped when device 12 is chilled to $T_c$. FIG. 7 shows a temperature profile 104 of semiconductor device 12 as it is cooled from an initial, relatively hot temperature $T_o$ down to the desired final temperature of $T_c$. The set point temperature $T_s$ of cooling member 26, however, is desirably maintained at a temperature below $T_c$. This allows semiconductor device 12 to be chilled to $T_c$ in a manner such that substantially all of the chilling can be accomplished in accordance with the rapid cooling rate associated with region 106. Thus, the asymptotic and very slow rate of chilling, associated with region 108 is entirely avoided. Generally, it has been found that setting $T_s$ at a temperature approximately 2° C. to 3° C. below $T_c$ has been suitable for achieving a desirable amount of chill boost. The chill boost approach is an extremely rapid and accurate method for accomplishing chilling. The chill boost method allows chilling to be completed as much as three times faster than using the conventional approach lacking a chill boost, mainly because the exponential, very slow rate of chilling associated with region 108 is entirely avoided.

Once device 12 is cooled to Tc, it is often desirable to maintain device 12 at equilibrium at Tc for a certain period of time as represented by profile region 109. This is easily accomplished using apparatus 10 of FIGS. 1a, 1, and 1c. Quite simply, to initiate chilling, bakeplate 20 is turned off and brought into thermal contact with cooling member 26 as shown in FIG. 1c. Device 12 is chilled as a result, and the device temperature begins to drop towards Tc. When device 12 reaches Tc, the configuration of FIG. 1c is maintained while bakeplate 20 is turned back on with just enough power to maintain wafer 12 at Tc. A suitable process control methodology can be used to control the heat output of bakeplate 20 in order to help maintain device 12 at the desired equilibrium temperature Tc.

Figure 10:
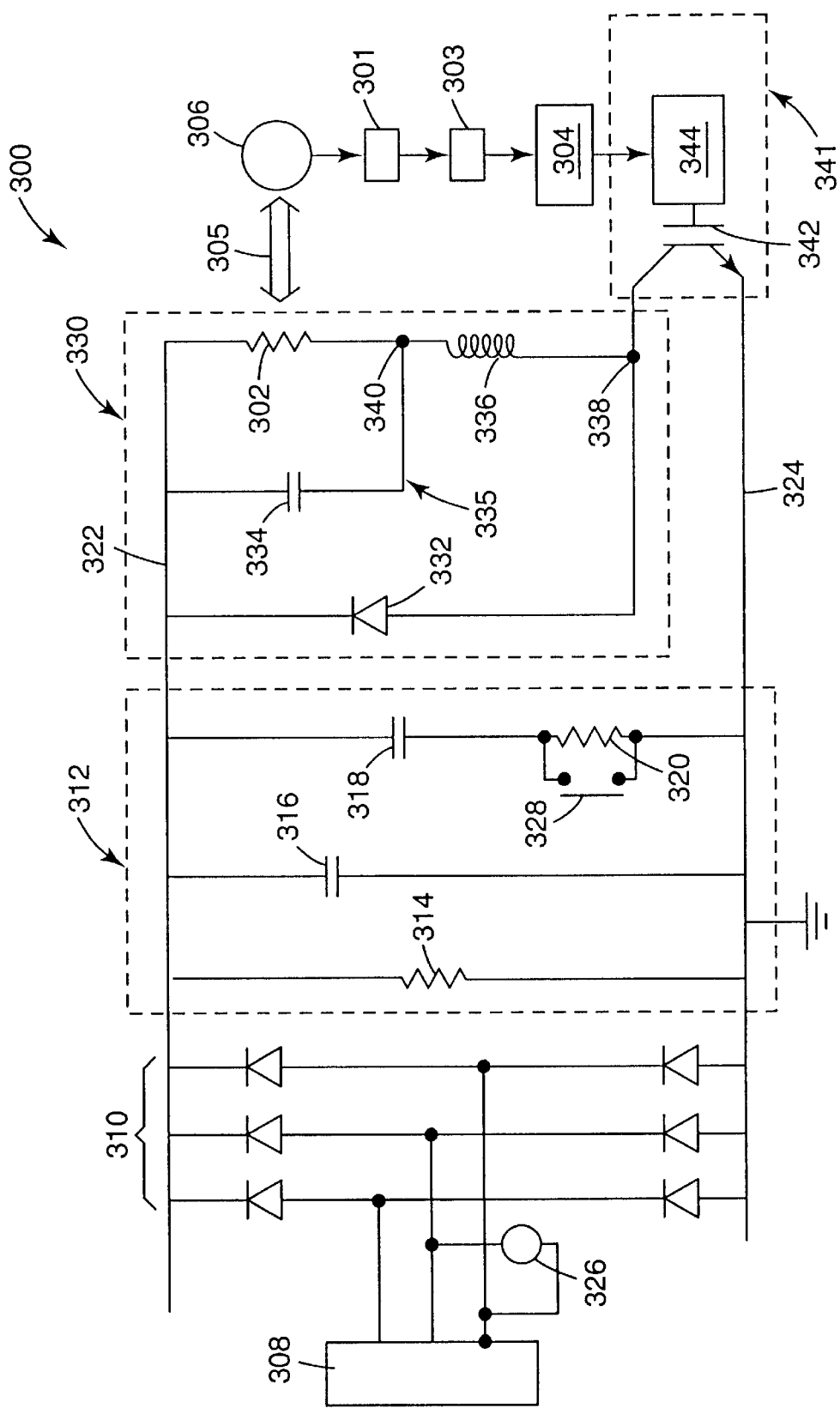
FIG. 10 is a schematic diagram of a preferred control system of the present invention for controlling the heat output of a heater.
Figure 11:
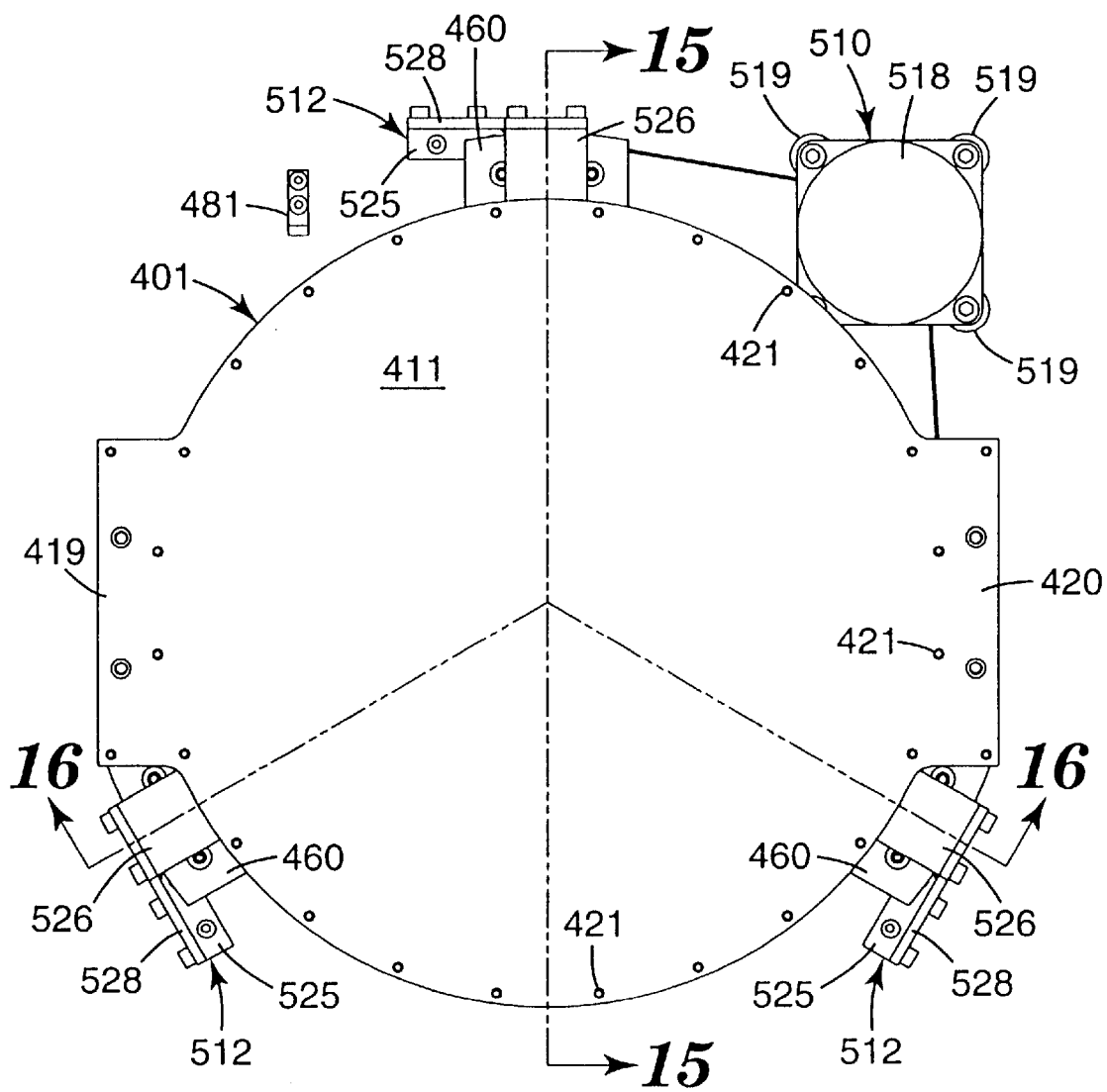
FIG. 11 is a top view of a preferred embodiment of a bake/chill station of the present invention.
Figure 12:
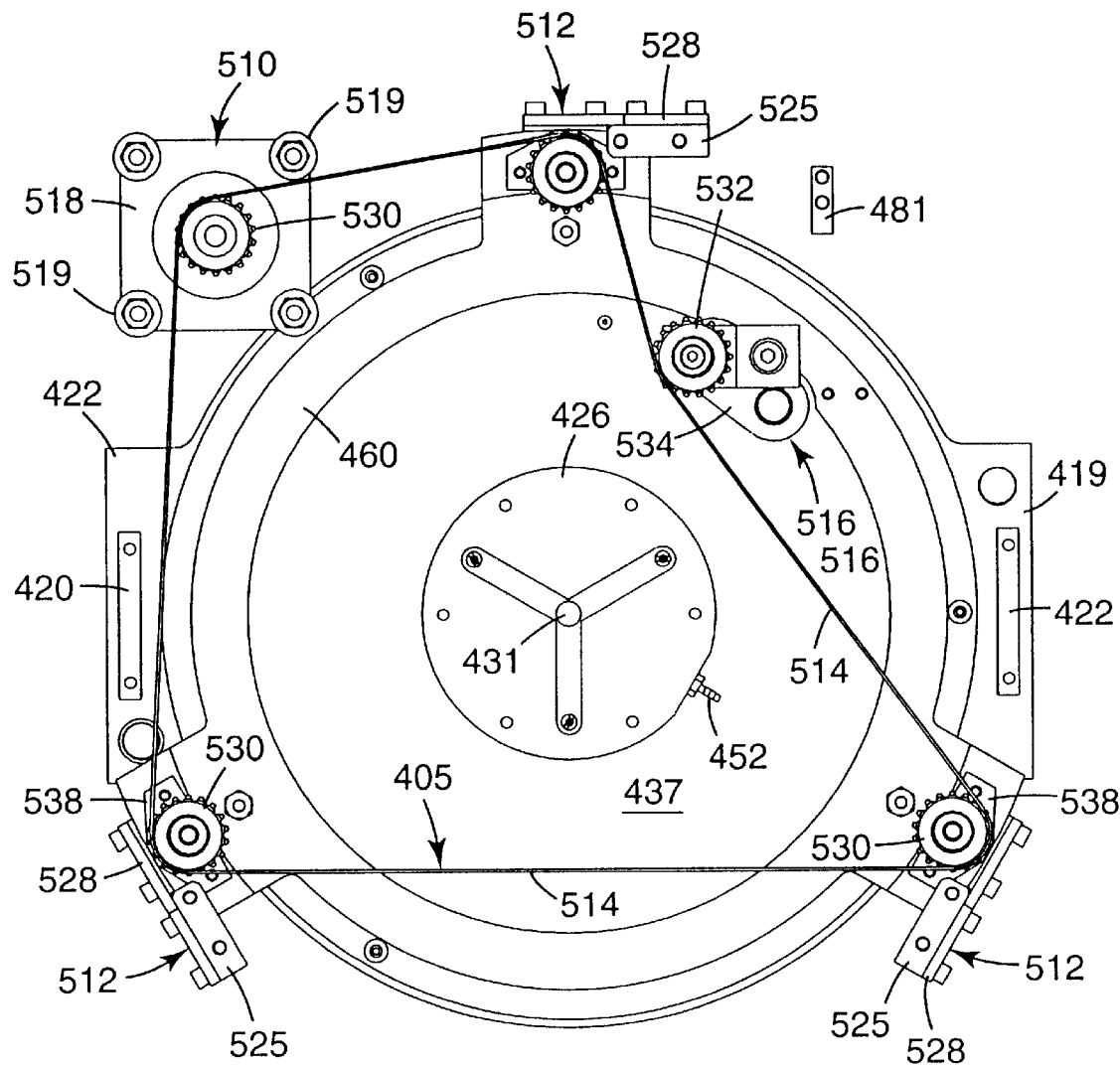
FIG. 12 is a bottom view of the bake/chill station of FIG. 11.
Figure 13:
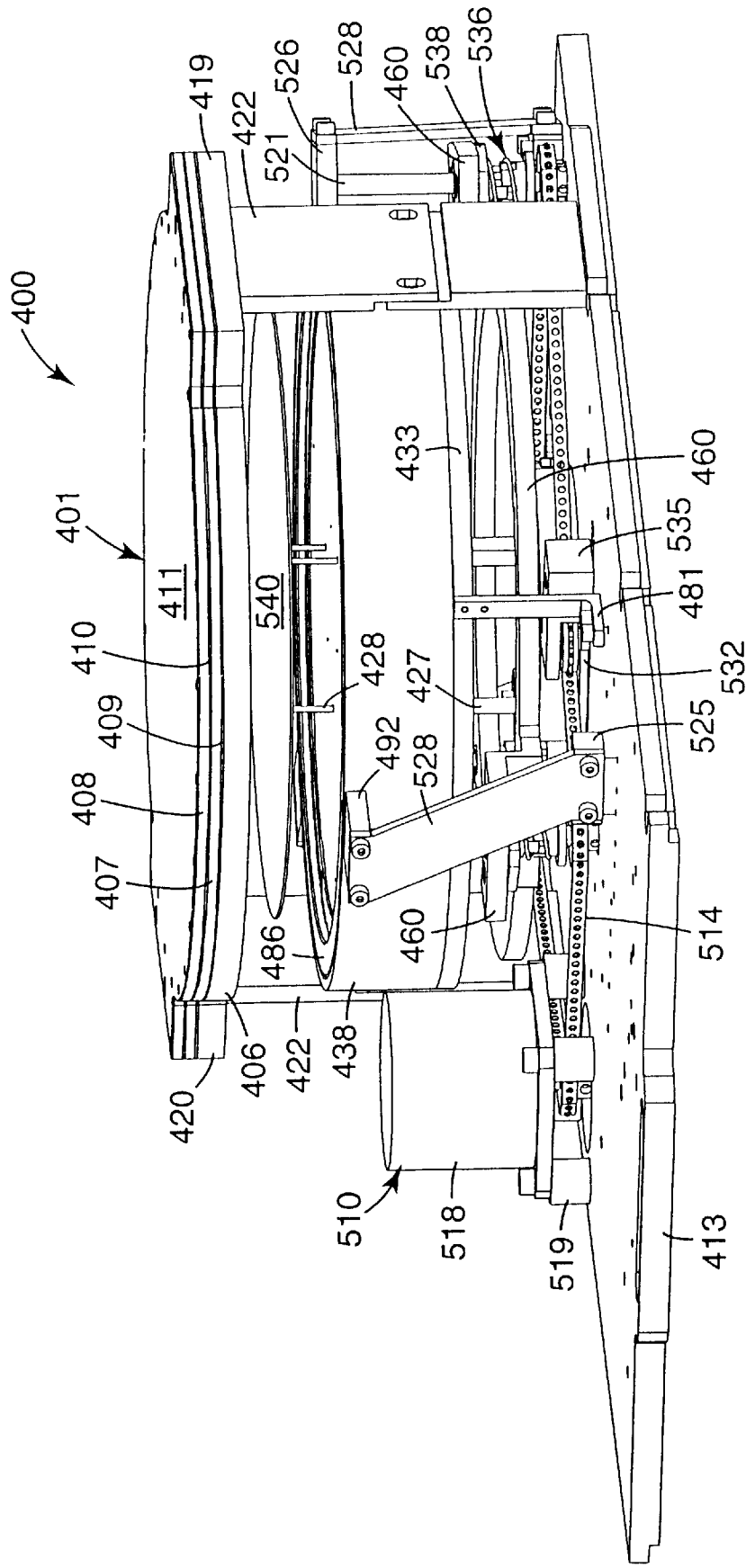
FIG. 13 is a perspective view of the bake/chill station of FIG. 11.
Figure 14:
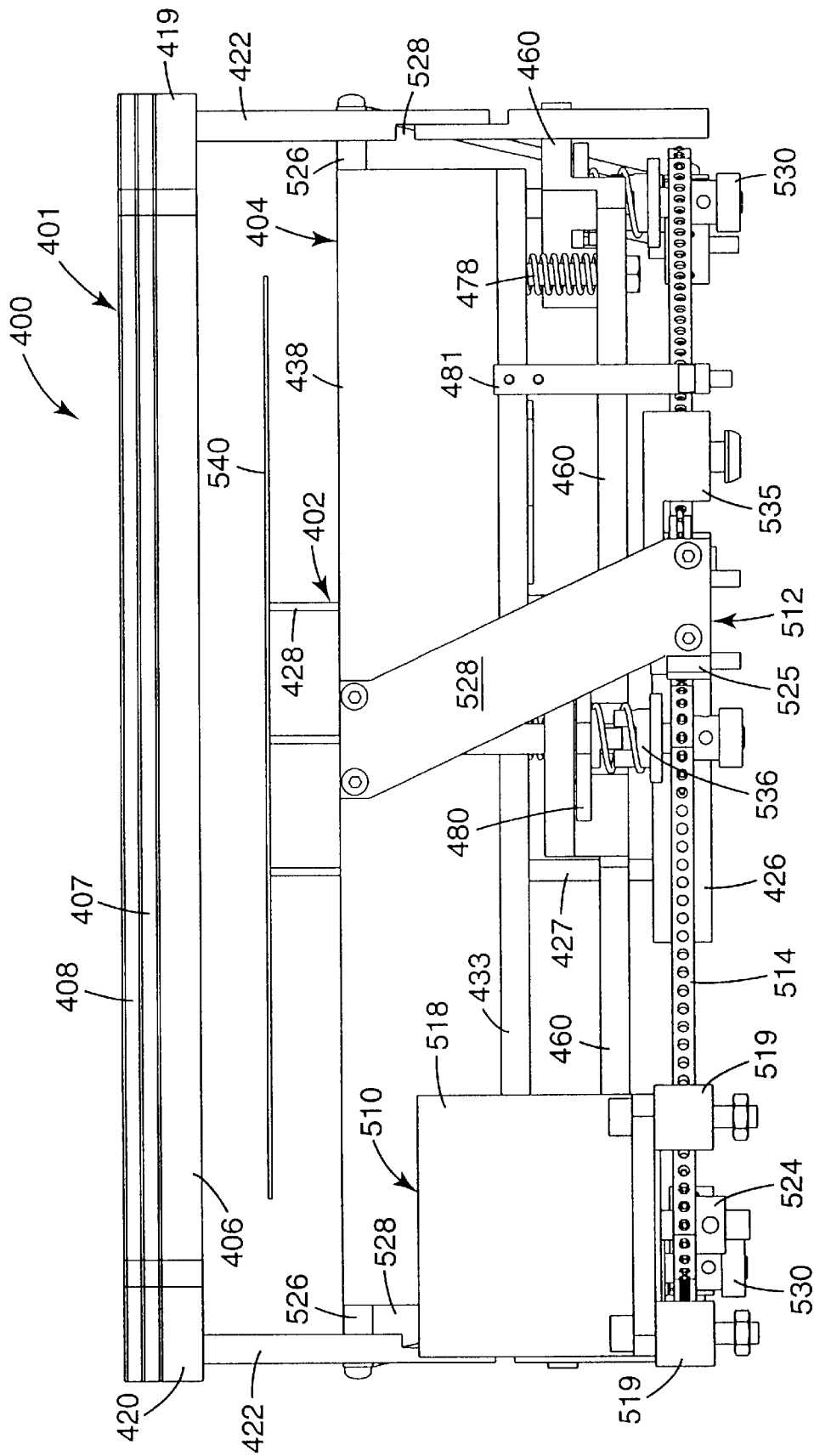
FIG. 14 is a side view of the bake/chill station of FIG. 11.

The ability to use the heat output of bakeplate 20 and the cooling effects of cooling member 26 in combination to maintain equilibrium temperatures and/or to control temperature profiles provides many significant advantages. First, equilibrium temperatures can be maintained with an extremely high level of accuracy over long periods of time. For example, this approach is precise and may be used to maintain wafer 12 at Tc with an accuracy of about +/−0.03° C., particularly when the control system described below in FIG. 10 is used to control the heat output of bakeplate 20. Second, the control approach is very responsive, because the heat from bakeplate 20 can be used to stop further chilling quite quickly. Third, the temperature of cooling member 26 does not need to be controlled very closely. As long as cooling member 26 is at a temperature below Tc, extremely accurate control of device temperature can be achieved by controlling the heat output of bakeplate 20. Fourth, because it is not necessary to control the temperature of cooling member 26 very closely, mechanisms ordinarily relied upon to supply cooling media to cooling member 26 at precise temperatures are entirely eliminated.

As an alternative way to stop chilling when it is not desired to maintain wafer at Tc for any length of time once Tc is reached, chilling can be stopped merely by separating bakeplate 20 from cooling member 26 at the appropriate time. When using this approach, it may be advantageous to be able to predict the point (the "chill end point") in the chilling process at which a control signal for halting the chilling process should be generated. This ensures that device 12 is cooled as closely as possible to the final chill temperature, Tc. In actual practice, such prediction preferably should take into the account the finite amount of lag time that is needed for apparatus 10 to respond to such a signal once such a signal is generated.

For example, with respect to apparatus 10 illustrated in FIGS. 1a, 1b, and 1c, it may take a small, but non-negligible time to physically separate bakeplate 20 from cooling member 26 following the time that a control signal to halt chilling is initially generated. Therefore, in anticipation of such a lag time, the control signal for halting the chilling process should be transmitted to apparatus 10 slightly in advance of the time at which semiconductor device 12 actually reaches the final, chill temperature, Tc. As a specific example, with a lag time of about 500 milliseconds, a separation signal may be sent out 500 milliseconds before semiconductor device 12 is predicted to be at Tc.

Determining the appropriate chill end point, with the lag time in mind, can be accomplished using any suitable open-loop or closed-loop process control technique. For example, a suitable control system, e.g., a control system using PID techniques, can be used to dynamically determine the chill end point at which a control signal should be sent to apparatus 10 in order to stop chilling at the proper time. Alternatively, one could characterize the parameters (e.g., wafer temperature, elapsed chilling time, lag time, etc.) associated with the chill end point, and then such parameters could be monitored to stop chilling in time.

Figure 8:
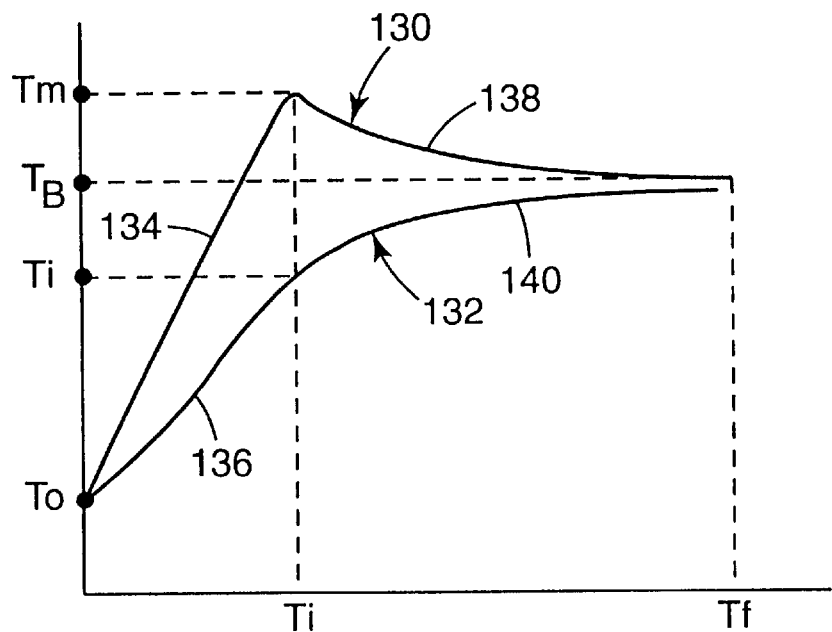
FIG. 8 is a temperature profile of a semiconductor device being heated to an equilibrium temperature without a chill boost.
Figure 9:
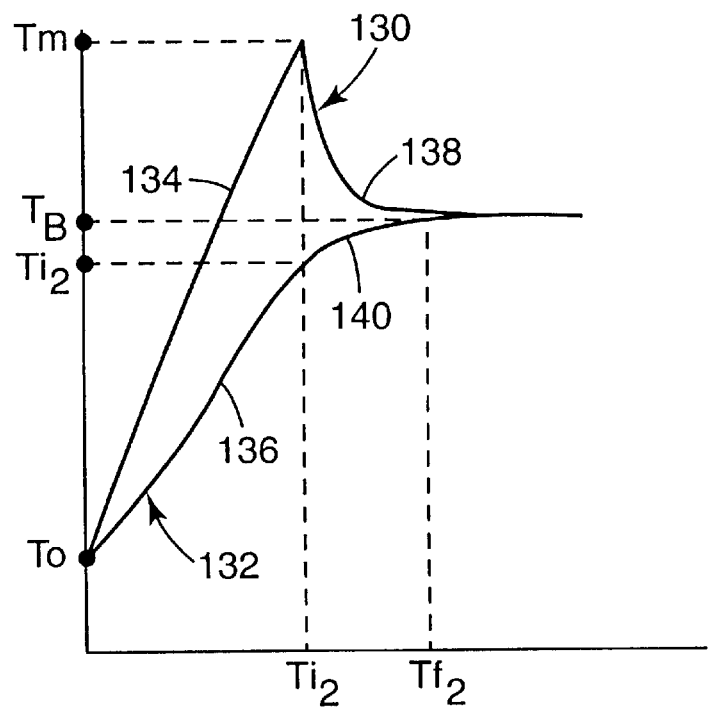
FIG. 9 is a temperature profile of a semiconductor device being heated to an equilibrium temperature with a chill boost.

The baking characteristics of apparatus 10 illustrated in FIGS. 1a, 1b, and 1c will now be further described with respect to FIGS. 8 and 9. FIG. 8 shows typical temperature profiles 130 and 132 of bakeplate 20 and semiconductor device 12, respectively, for a baking operation in which device 12 is heated from a temperature $T_o$ (e.g., room temperature) up to a temperature $T_B$ (e.g., 130° C.) over a period $t_f$. During such heating, bakeplate profile 130 generally leads device profile 132. That is, bakeplate 20 tends to be somewhat hotter than device 12 at all times during heating until bakeplate 20 and device 12 reach an equilibrium temperature substantially corresponding to $T_B$, preferably within +/−0.03° C. of $T_B$. The temperature of bakeplate 20, therefore, must be allowed to overshoot $T_B$ to make sure that device 12 reaches $T_B$. At some point in the heating process, therefore, the heat output of bakeplate 20 is reduced to allow device 12 and bakeplate 20 to asymptotically approach and substantially reach $T_B$. This typically occurs after a time $t_i$ when bakeplate is at a maximum temperature $T_m$ above $T_B$ but while device 12 is at a temperature $T_i$ below $T_B$. The precise time $t_i$ at which the heat output of bakeplate 20 is reduced depends upon the time constant of the system, and is a typical output of a conventional PID controller.

The heating approach of FIG. 8 results in a relatively rapid heating rate in profile regions 134 and 136 before the heat output of bakeplate 20 is reduced. However, the heating rate slows exponentially in profile regions 138 and 140 once bakeplate 20 is powered down at time $t_i$. In fact, at least about 70% of the time required to heat device 12 from $T_o$ to $T_B$ involves asymptotically heating device 12 from $T_i$ to $T_B$, even though the temperature difference between $T_B$ and $T_i$ is generally a small fraction of the total temperature range extending from $T_o$ to $T_B$. In other words, a substantial amount of heating time is spent adding the last few degrees of heat to device 12. Much heating time is invested to achieve a moderate change in temperature needed to get device 12 up to $T_B$.

Of course, the heating approach of FIG. 8 may be used with beneficial results in the practice of the present invention, if desired. Indeed, the approach of FIG. 8 allows device 12 to be heated from $T_o$ to $T_B$ as rapidly as 40 to 50 seconds. However, even faster performance can be achieved when using the principles of the present invention. Specifically, the time inefficiencies associated with profile regions 138 and 140 can be substantially reduced by using a "chill boost" from cooling member 26. Generally, according to the "chill boost" approach for baking, bakeplate 20 is allowed to reach a temperature higher than even $T_m$ in order to allow device 12 to be heated up to a temperature much closer to $T_B$ before powering down bakeplate 20. Cooling member 26 is then used to rapidly draw excess heat from bakeplate 20 to help ensure that the temperature of device 12 substantially reaches but does not overshoot $T_B$.

The benefits of the "chill boost" method of heating are illustrated in FIG. 9. FIG. 9 is generally identical to FIG. 8, except that bakeplate 20 reaches a higher maximum temperature $T_{m2}$ (as compared to $T_m$) and device 12 reaches a higher temperature $T_{i2}$ (as compared to $T_i$) when the heat output of bakeplate 20 is reduced at time $t_{i2}$. In the absence of corrective action, and if the heating scheme of FIG. 8 were to be used at this point without a chill boost, the excess heat in both bakeplate 20 and device 12 would ordinarily cause the temperature of device 12 to overshoot $T_B$. That is, bakeplate 20 and device 12 would asymptotically approach some equilibrium temperature above $T_B$. However, in this instance, cooling member 26 is brought into thermal contact with bakeplate 20 under conditions effective to ensure that the excess heat is drawn into cooling member 26. As a consequence, bakeplate 20 and device 12 substantially reach $T_B$ at a time $t_{f2}$ substantially less than time $t_f$. While the temperature of device 12 will still tend to asymptotically approach $T_B$ after bakeplate 20 is powered down, the time period associated with such asymptotic heating is substantially reduced relative to that associated with FIG. 8. For example, although the heating method of FIG. 8 might take 40 to 50 seconds to complete, this time would be reduced to about 25 to 35 seconds using the "chill boost" approach of FIG. 9.

Conventional control systems of the type previously used with conventional bake and/or chill apparatuses are too slow to be able to provide meaningful control of the bake/chill apparatus of the present invention. The present invention, however, relies upon an innovative heater control approach that provides rapid and precise control over heater temperature. According to the invention, a high frequency (e.g., preferably a frequency above 1000 Hz), pulse width modulated control signal is used to modulate DC electrical energy supplied to a heater incorporated into an RLC (resistance/inductor/capacitor) circuit in which the heater is the resistance and the inductor and capacitor help smooth the DC voltage level across the heater. With this approach, the amount of voltage controllably established across the heater may be rapidly and continuously varied within a power range from 0 to 100%. In practical effect, the DC electrical voltage developed across the heater has practically infinitely small granularity. This allows heater temperature to be controlled with agility and precision over a wide dynamic range.

Accordingly, FIG. 10 is a schematic diagram of one embodiment of an innovative control system 300 of the present invention in which DC power is modulated using a high frequency PWM control signal to control the heat output of a low thermal mass bakeplate of the present invention. In system 300, resistor 302 represents the resistance of the bakeplate. As an overview, controller 304 develops a high frequency, pulse width modulated control signal in response to temperature signals generated by temperature sensor 306. Temperature sensor is thermally coupled to bakeplate 302, as indicated by double-headed arrow 305. The PWM control signal is used to operate switch 342 for the "on" portion of the duty cycle of each pulse of the control signal. This establishes a corresponding voltage across resistor 302 that is proportional to the duty cycle of the PWM control signal. The power output of the heater is then proportional to the square of such voltage.

For example, if the DC power is supplied at 300 volts, a 20,000 Hz PWM control signal having a duty cycle of 10% will establish 30 volts (10% of 300 volts) across resistor 302 and a corresponding 1% heat output. If the DC power is supplied at 300 volts, a 20,000 Hz PWM control signal having a duty cycle of 60% will establish 180 volts (60% of 300 volts) across resistor 302 and a 36% heat output. Similarly, if the DC power is supplied at 300 volts, a 20,000 Hz PWM control signal having a duty cycle of 5% will establish 15 volts (5% of 300 volts) across resistor 302, and hence a 0.25% heat output.

Referring to the features of system 300 in more detail now, temperature sensor 306 transmits information comprising temperature signals to controller 304. System 300 desirably includes conventional driver circuit 301 and noise filter 303 to process the temperature data acquired from temperature sensor 306 before the data reaches controller 304. If temperature sensor 306 is a hybrid sensor comprising multiple sensors, corresponding drivers and/or noise filters may be used for each such sensor component. Driver circuit 301 is used to adjust the amplitude of the detected temperature signal, if desired, and/or to convent the detected data into an alternate form more suitable for further processing. Noise filter 303 reduces the noise content, i.e., increases the signal to noise ratio, of the temperature sensor signal to enhance its processability by controller 304.

Controller 304 may be comprised of any combination of hardware, software, and the like, effective to enable controller 304 to generate a PWM control signal from the temperature sensor input. In generating the PWM output from such information, any suitable process control methodology and componentry may be used, although techniques of proportional/integral/derivative (PID) control are preferred. PID control, and principles of process control generally, are described in Coughanowr and Koppel, *Process Systems Analysis and Control*, McGraw-Hill Book Company (1965); and F. G. Shinskey, *Process Control Systems* (1988).

Controller 304 may be formed from hardware, software, or combinations thereof. Controller 304 may be digital and/or analog. A variety of commercially available systems suitable for use as controller 304 are commercially available, and these may be purchased and incorporated into system 300 in plug-and-play fashion. For example, in one embodiment, a PC-based control and analysis system commercially available under the trade designation "LABVIEW" from National Instruments, Austin, Tex. may be used as controller 304. Alternatively, and more preferably, controller 304 may be in the form of an embedded controller incorporating one or more microprocessors and/or digital signal processors (DSP's). DSP's are fast, reliable, and inexpensive. DSP's are described, for example, in Curran, L., Machine Design, "DSPs Find a Place in Motor Control", pages 95–102 (Nov. 6, 1997). Representative examples of suitable DSP device sets are commerically available from Analog Devices, Inc. and include (i) the AD7715 (16 bit sigma delta ADC) device or the AD7711 (signal conditioning ADC with RTD excitation current) device, and (ii) the ADSP-2100 (digital processor) device.

The operator may interact with controller 304 either directly or indirectly as desired. For example, in preferred embodiments involving indirect interaction, an operator may interface directly with a host computer that, in turn, is interfaced with controller 304. The POLARIS® microlithography cluster uses such indirect interaction through a host computer.

Controller 304 may be configured to generate PWM control signals having one or more frequencies within a broad range. In selecting a suitable frequency, or range of frequencies if desired, at which to generate the PWM control signals, the selected frequency or frequencies should be high enough to achieve the desired amount of accuracy in temperature control but not so high that switch time or noise problems arise. Generally, PWM control signals having a frequency in the range from 1000 Hz to 50,000 Hz, preferably about 20,000 Hz would be suitable.

In those embodiments in which temperature sensor 306 is a hybrid sensor incorporating both a thermocouple and an RTD temperature sensor, controller 304 may also include componentry in the form of hardware circuitry, software, or combinations thereof, that is capable of using data generated by the RTD sensor to calibrate the thermocouple temperature sensor. In these embodiments, controller 304 would be operationally coupled to both the RTD and thermocouple sensors in a manner such that the sensed temperature data detected by both devices can be received as input signals to controller 304. The corresponding calibration componentry of controller 304 then allows controller 304 to automatically, on-line calibrate the thermocouple. Calibration may be accomplished using sensed temperature data obtained by the RTD and thermocouple sensors at any period during, the bake/chill process. Calibration, however, is most easily accomplished by using sensed temperature data obtained while bakeplate 124 is being maintained at an equilibrium temperature.

The PWM output from controller 304 is transmitted to controllable switch circuitry 341, comprising controllable switch 342 (shown in the preferred form as an insulated gate bipolar transistor, i.e., "IGBT", switch) and driver circuit 344 (shown in the preferred form as an IGBT driver circuit). Driver circuit 344 receives the PWM control signals from controller 304 and uses the control signals to open and close controllable switch 342 in a corresponding manner. This will be described in more detail below in connection with a preferred mode of operation of system 300. One representative embodiment of controllable switch circuitry 341 incorporates the IMBC 15-060 discrete IGBT as controllable switch 342 and the EXB840 hybrid IC IGBT Driver as driver circuit 344. Both are available from Fuji Electric Company, Ltd. The electrical schematic for this combination of devices is shown in product literature made available by the vendor.

System 300 is configured to receive electrical power from AC power supply 308. In the United States, AC power supply 308 is most commonly a utility supplying three-phase, 60 Hz AC electrical current at 208 volts RMS. System 300 incorporates rectifier circuitry 310 in order to convert the AC power into DC power. For example, 208 AC volts RMS is rectified to 294 volts DC. In the embodiment shown in FIG. 10, rectifier 310 is shown in the preferred form as a six diode rectifier, although any suitable rectifying means may be used as desired. A six diode rectifier assembly is a common device packaged and sold as a single unit and may be obtained from a number of commercial sources. For example, a six diode rectifier assembly available under the trade designation DF30BA80 from Sansha Electric Manufacturing Co., Ltd., Japan, has been found to be suitable in the practice of the present invention.

The DC power developed by rectifier 310 tends to be produced in a pulsating form that may include an undesirable level of "AC ripple". Accordingly, system 300 desirably includes smoothing circuit section 312 in order to smooth the DC pulses and thereby develop smoother DC power with a reduced amount of "AC ripple". The smoothed DC power can then be applied to resistor 302 in modulated fashion as will be described below. The preferred smoothing circuit section 312 as shown includes resistor 314, capacitor 316, capacitor 318, and resistor 320 generally connected in parallel between top terminal 322 and ground terminal 324. Smoothing circuit section 312 also incorporates a relay switch including relay coil 326 and normally-open (N.O.) contact 328.

Referring now to the components of smoothing circuit section 312 in more detail, capacitor 316 is a relatively low value, high frequency capacitor that helps prevent high frequency noise from being transmitted back to the main power supply 308. In a preferred embodiment, capacitor 316 is a 0.01 $\mu$F, 600 V, polypropylene type capacitor. Capacitor 318 is a relatively large value capacitor that is used to provide DC filtering. In a preferred embodiment, capacitor 318 is an electrolytic-type capacitor rated at 2200 $\mu$F and 600 V. Resistor 314 is a high value resistor that helps bleed charge from capacitor 318 when system. 200 is powered off. In order to bleed charge away from capacitor 318 over a period of about 10 seconds, for instance, resistor 314 preferably is a 5000 $\Omega$, 20 watt resistor.

Resistor 320 and relay switch components 326 and 328 help slow the rate at which capacitor 318 charges and discharges when system 300 is powered on. When system 300 is powered on, for instance, relay coil 326 is energized, causing N.O. contact 328 to close after some delay, e.g., 0.1 seconds. The delay causes current initially to flow through both capacitor 318 and resistor 320, thus limiting the initial charging current through capacitor 318. The charging rate of capacitor 318 slows down as a result. After capacitor 318 is sufficiently charged and N.O. contact 328 closes, the current thereafter bypasses resistor 320 by flowing through the closed contact. In a preferred embodiment, resistor 320 is a 100 $\Omega$, 10 watt resistor.

Resistor 302 represents the resistance of the bakeplate whose heat output is to be controlled. Resistor 302 is incorporated into load circuit section 330 of system 300. In addition to resistor 302, load circuit section 330 further includes diode 332, capacitor 334, and inductor 336 connected together between top terminal 322 and load circuit bottom terminal 338. Within load circuit section 330, capacitor 334 and resistor 302 are connected in parallel with each other in RC circuit portion 335 between top terminal 322 and intermediate load section terminal 340. Inductor 336 and RC circuit portion 335 are connected to each other in series between top terminal 322 and load circuit bottom terminal 338. Within load circuit section 330, resistor 302, inductor 336 and capacitor 334 function like a 2-pole, low pass filter to smooth the DC voltage developed across resistor 302. In practical effect, the "filter" passes DC current but suppresses AC current at the frequency of the PWM output of controller 304. In a typical embodiment in which the PWM output has a frequency of 20,000 Hz, inductor 336 is a 4 mH, 10 A, inductor capable of operating at 20 kHz, and capacitor 334 is a 5 $\mu$F, high frequency, 600 V capacitor. Resistor 302 is typically 35 $\Omega$. The resultant RLC circuit suppresses 20,000 Hz AC current.

Load circuit bottom terminal 338 is coupled back to top terminal 322 by diode 332. Diode 332 provides numerous performance advantages. Diode 332 acts as a back or "fly wheel" diode in order to clamp the voltage at the bottom of terminal 338 when switch 342 is turned off. Diode 332 thus makes it easier to maintain the desired DC current through resistor 302. Diode 332 is preferably a type ERW05-060, available from Fuji Electric Company, Ltd. Load circuit bottom terminal 338 is also coupled to the collector of controllable IGBT switch 342.

A preferred mode of operation of system 300 will now be described in which a 20,000 Hz PWM control signal is applied to switch 342 in order to control the heat output of resistor 302 when using 294 volt DC power derived from AC power source 308. Temperature sensor 306 develops an electrical signal representative of the temperature reading of the workpiece supported upon resistor 302. The electrical signal representative of workpiece temperature is then transmitted to controller 304, desirably after being processed through driver 301 and noise filter 303. Controller 304 receives the output of noise filter 303 and applies PID control in order to develop a PWM output having a duty cycle dependent upon the degree to which resistor 302 deviates from the desired temperature. Depending upon the circumstances, controller 304 can use PID control to determine and generate a PWM control signal having the appropriate duty cycle to adjust or maintain the heat output of resistor 302.

The PWM output of controller 304 is then transmitted to IGBT driver 344. IGBT driver circuit 344 uses the control signal from controller 304 to open and close switch 342 in a corresponding manner. For example, if controller 304 develops a 20,000 Hz PWM control signal having a duty cycle of 25%, then switch 342 will be opened and closed at a rate of 20,000 Hz with switch 342 being closed at a 25% duty cycle. Similarly, if controller 304 were to increase the duty cycle of the signal to 70%, then switch 342 would be opened and closed at a rate of 20,000 Hz except that the switch would be closed for 70% of each PWM interval.

Actuating switch 342 in this manner allows the heat output of resistor 302 to be easily controlled. Generally, increasing the duty cycle of the PWM control signal tends to increase the voltage across, and hence heat output of, resistor 302. Similarly, decreasing the duty cycle of the PWM control signal tends to decrease the voltage across, and hence heat output of, resistor 302. In actual practice, switch 342 can be activated to open and close in response to PWM control pulses having a duty cycle in the range from 0% to 100%. However, even though switch 342 is being actuated at a high frequency, e.g., 20,000 Hz, the time constant of load circuit portion 330 is typically much slower than this, because capacitor 334 and inductor 336 tremendously smooth the voltage developed across resistor 302. Consequently, the voltage developed across, and hence heat output of, resistor 302 actually is tremendously smooth and steady, being proportional to the average duty cycle of the PWM control signal as described above.

FIGS. 11–22 show a particularly preferred embodiment of a bake/chill apparatus 400 of the present invention incorporating the principles of the present invention described above in connection with FIGS. 1a through 10. Apparatus 400, for purposes of discussion, is an embodiment of the present invention suitable for processing a workpiece in the form of wafer 540. As an overview, apparatus 400 includes five major subassemblies for carrying out baking and chilling operations. These five subassemblies include lid assembly 401, wafer support assembly 402, bakeplate assembly 403, cooling member assembly 404, and drive train assembly 405. These five assemblies are supported over and/or mounted to main base 413. Drive train assembly 405 includes components that cause upward and downward movement of the bakeplate and cooling member in order to place apparatus 400 into one of three operational configurations including a loading/unloading configuration, a chilling configuration, and a baking configuration. Initially, apparatus 400 will be described with respect to FIGS. 11 through 19, which show apparatus 400 in the loading/unloading configuration. All three configurations, as well as the operation of apparatus 400, will be described further below in connection with FIGS. 20–22.

Referring now primarily to FIGS. 11 and 13–16, lid assembly 401 includes a stacked assembly of essentially ring-shaped side wall members 406, 407 and 408 and bottom, middle, and top panels 409, 410, and 411, respectively. These stacked components define upper plenum 412, lower plenum 414, and lid recess 415 (see FIGS. 15–16 primarily) adapted to receive portions of heater assembly 406 during baking and chilling operations. Spacer ring 416 positioned in the center of lower plenum 414, and secured by screws 451, helps to maintain the spacing between bottom panel 409 and middle panel 410 and also divides lower plenum 414 into outer plenum portion 417 and an inner plenum portion 418. The stacked components of lid assembly 401 are held together using suitable fasteners 421, which may be screws, rivets, bolts, or the like.

Side wall members 406, 407, and 408 are structured to provide generally rectangular shoulders 419 and 420, one of which includes an intake passageway (not shown) through which one or more gases can be caused to flow into outer plenum portion 417. The other shoulder includes an exhaust passage (not shown) through which gases can be exhausted from upper plenum 412. Apertures (not shown) are distributed around bottom panel 409 proximal to outer plenum portion 417 so that gases in outer plenum portion 417 can flow downward into lid recess 415 and thereby blanket the workpiece 540 in the form of a wafer being processed. Apertures (not shown) are also distributed in bottom panel 409 and middle panel 410 proximal to inner plenum portion 418 so that gases can flow upward through inner plenum portion 418 and into upper plenum 412. From upper plenum 412, the gas is exhausted through the exhaust passage of the corresponding shoulder 419 or 420, as the case may be.

Lid assembly 401 is supported upon a pair of lid support posts 422 in a stationary manner, and, consequently, lid assembly 401 does not move during baking and chilling operations. Each lid post 422 is attached to a corresponding shoulder 419 or 420. Unless noted otherwise herein, the components of lid assembly 401 and posts 422 preferably are formed of stainless steel although other materials such as aluminum, high temperature plastics such as polyamide, polyimide, polyamideimide, and the like, can be used.

In a typical embodiment, for instance, panels 409, 410, and 411 may be in the form of stainless steel sheets having a thickness on the order of 0.9 mm to 1.2 mm. However, such a bottom panel 409 may have a relatively large thermal mass that can interfere with the ability to accurately control temperature during baking and/or chilling operations. In order to overcome this effect and to promote more uniform heating and cooling, bottom panel 409 may be in the form of a low thermal mass membrane, i.e., a membrane having a thickness or the order of 0.05 to 0.1 mm, preferably having infrared ("IR") reflective characteristics on inward facing surface 424. Advantageously, such a low thermal mass membrane helps reduce the influence of external, environmental effects upon baking and chilling operations for at least two reasons. In the first instance, the IR reflective, inward facing surface 424 tends to reflect radiant heat energy back into the interior of apparatus 400 so that less radiant heat energy is able to reach and be absorbed by bottom panel 409. In the second instance, plenums 412 and 414 help to thermally insulate bottom panel 409 from the external environment. These features significantly reduce the amount of heat that would otherwise be absorbed by bottom panel 409 from above or below, thus helping to negate the thermal mass of bottom panel 409 as a practical matter.

Preferably, the low thermal mass, IR reflective embodiment of bottom panel 409 comprises a polymeric substrate bearing an IR reflective coating on the substrate surface corresponding to inward facing surface 424. In order to avoid undue distortion or degradation during baking operations, the polymeric substrate is preferably formed from a polymer having a glass transition temperature (Tg) above the highest temperature likely to be realized during baking operations. Accordingly, high Tg polymers such as polyimide, polyamide, polyamideimide, and the like are preferred. The IR reflective coating may be formed from any temperature resistant, IR reflective material of which metals, metal alloys, and intermetallic compositions of gold, aluminum, nickel, combinations of these, and the like, are preferred. In a particularly preferred embodiment, bottom panel 409 is a KAPTON brand polyamide substrate having a thickness of about 50 micrometers and having at least one surface metallized with an aluminum alloy.

The components of wafer support assembly 402 are best seen in FIGS. 12–16. There, lift pin base 426 supports a trio of lift pin shafts 427 arranged in triangular fashion at 120 intervals around lift pin base 426. Lift pins 428 extend from lift pin shafts 427 at a height appropriate for receiving wafer 540. Each shaft 427 and lift pin 428 has cooperating structure allowing spring 430 to fixedly hold lift pin 428 in place. Lift pin shafts 427 and lift pins 428 optionally may be hollow in order to allow a vacuum to be pulled against a wafer 540 supported on lift pins 428, if desired. The vacuum is developed through chamber 431 which is connected to the inside of each lift pin shaft 427 by a corresponding conduit 432. Hose coupling 452 provides an attachment site on lift pin base 426 for a hose through which a vacuum can be pulled if desired.

Figure 15:
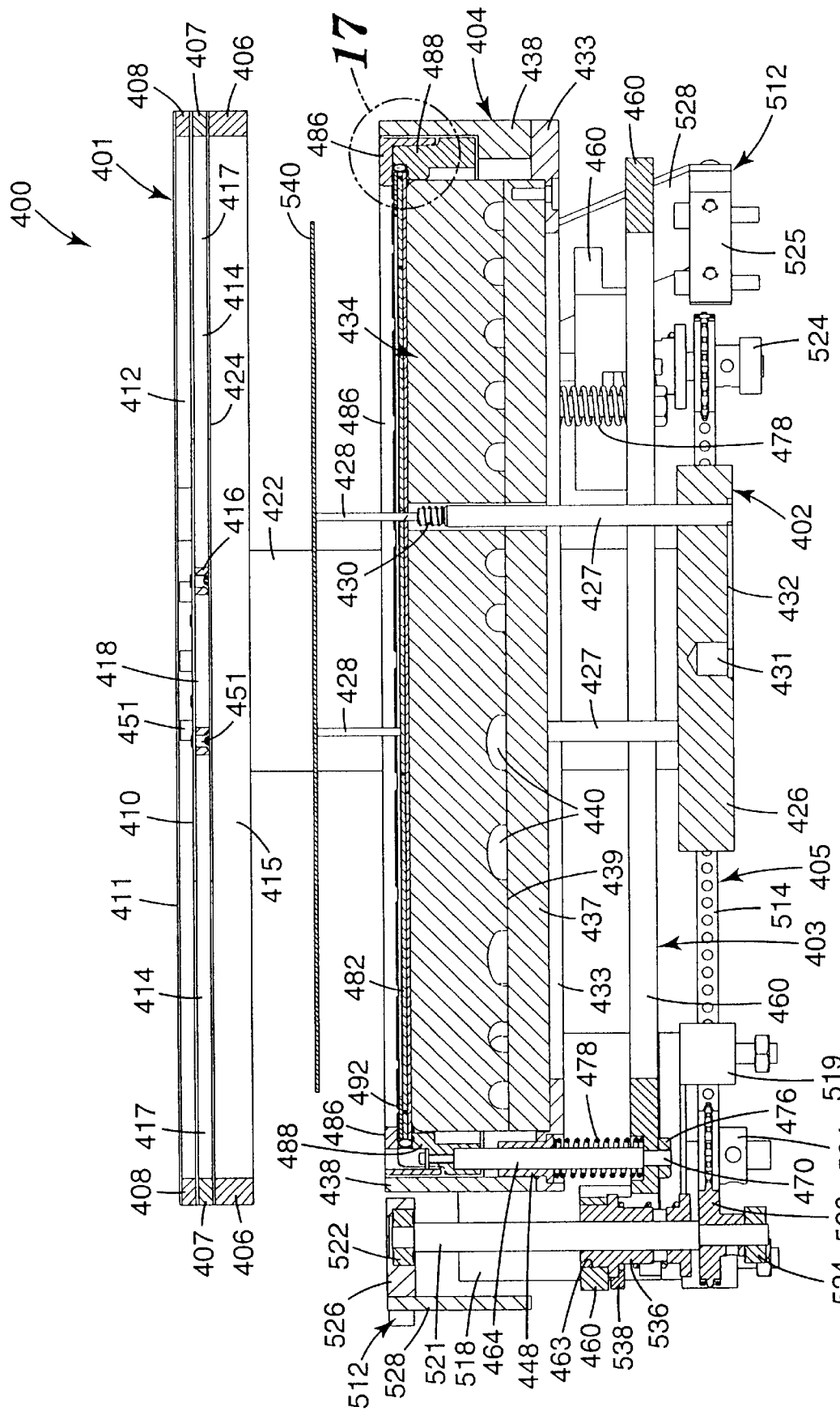
FIG. 15 is a side view of the bake/chill station of FIG. 11 shown in a cross section taken along line 15—15 of FIG. 11.
Figure 16:
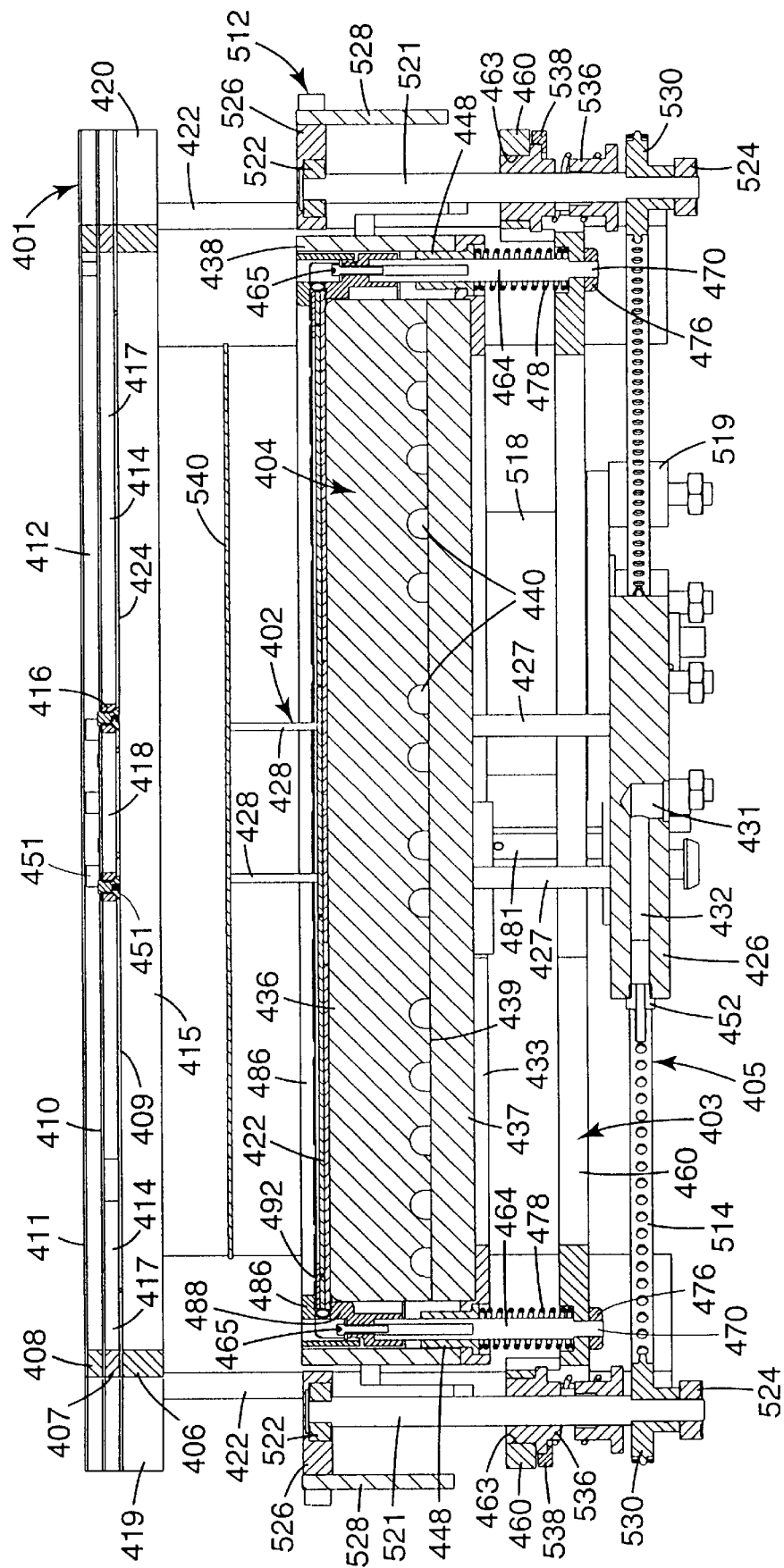
FIG. 16 is a cross-sectional side view of the bake/chill station of FIG. 11 taken along line 16—16 of FIG. 1.

The features of cooling member assembly 404 are best shown in FIGS. 15 and 16. Cooling member assembly 404 includes annular support ring 433, cooling member 434 supported upon support ring 433, and flanged, hollow bearings 448 through which cooling member 434 and annular support ring 433 slideably engage heater support shafts 464. Flanged, hollow bearings 448 can be welded, glued, press fit, or threadably mounted in place. Although not shown, the frictional interface between these components can be provided with a lubricant to facilitate free upward and downward movement of annular support ring 433 and cooling member 434 over heater support shafts 464.

As shown in FIGS. 15–16, cooling member assembly 404 is in its lowest position in apparatus 400. Apparatus 400 is thus open, and wafer 540 can be easily inserted for processing. During baking and chilling operations, the components of cooling member assembly 404 can be moved upward until cooling member assembly 404 engages lid assembly 401. Any further upward movement of cooling member assembly 404 is thus constrained by this engagement. This action closes apparatus 400 and allows the wafer to be baked and chilled in an environmentally sealed chamber. When baking and chilling are complete, cooling member assembly 404 can be lowered to open apparatus 400, allowing the processed wafer to be removed and another wafer to be inserted.

In more detail, cooling member 434 includes upper chill plate 436, lower chill plate 437, and sidewall member 438. The bottom surface 439 of upper chill plate 436 is grooved to define cooling media channels 440 when upper and lower chill plates 436 and 437 are assembled. Both upper and lower chill plates 436 and 437 are desirably formed from a thermally conductive material such as a metal, metal alloy or intermetallic composition of which metal alloys such as stainless steel, an aluminum alloy, or passivated (e.g., nickel-plated) copper are preferred.

The top of sidewall member 438 optionally may be grooved (not shown) to receive an O-ring (not shown) so that sidewall member 438 can sealingly engage lid assembly 401. Sidewall member 438 may be formed integrally with either upper chill plate 436 or lower chill plate 437, or as shown, can be formed as a separate piece. When formed separately, sidewall member 438 can be formed from a thermally conductive material such as stainless steel or aluminum, or can be formed from an insulating material such as polyimide, polyamide, polyamideimide, ultrahigh molecular weight polyethylene, or the like.

In terms of assembly, chill plates 436, 437, and sidewall member 438 (when formed as a separate piece) may be assembled to form cooling member 434 using any desired means such as screws, bolts, glue, welding, or the like. The assembled cooling member 434 may then be fixedly attached to support ring 433 using any convenient means such as screws, bolts, glue, welding, or the like. Preferably, cooling member 434 is assembled from its component parts and then attached to annular support ring 433 using screws 441 so that apparatus 400 can be disassembled and reassembled for maintenance and inspection. Upper and lower chill plates 436 and 437 preferably are structured to fit over lift pin shafts 427 and lift pins 428 so that cooling member 434 does not slideably engage lift pin shafts 427 or lift pins 428 during upward and downward movement of cooling member 434.

Figure 17:
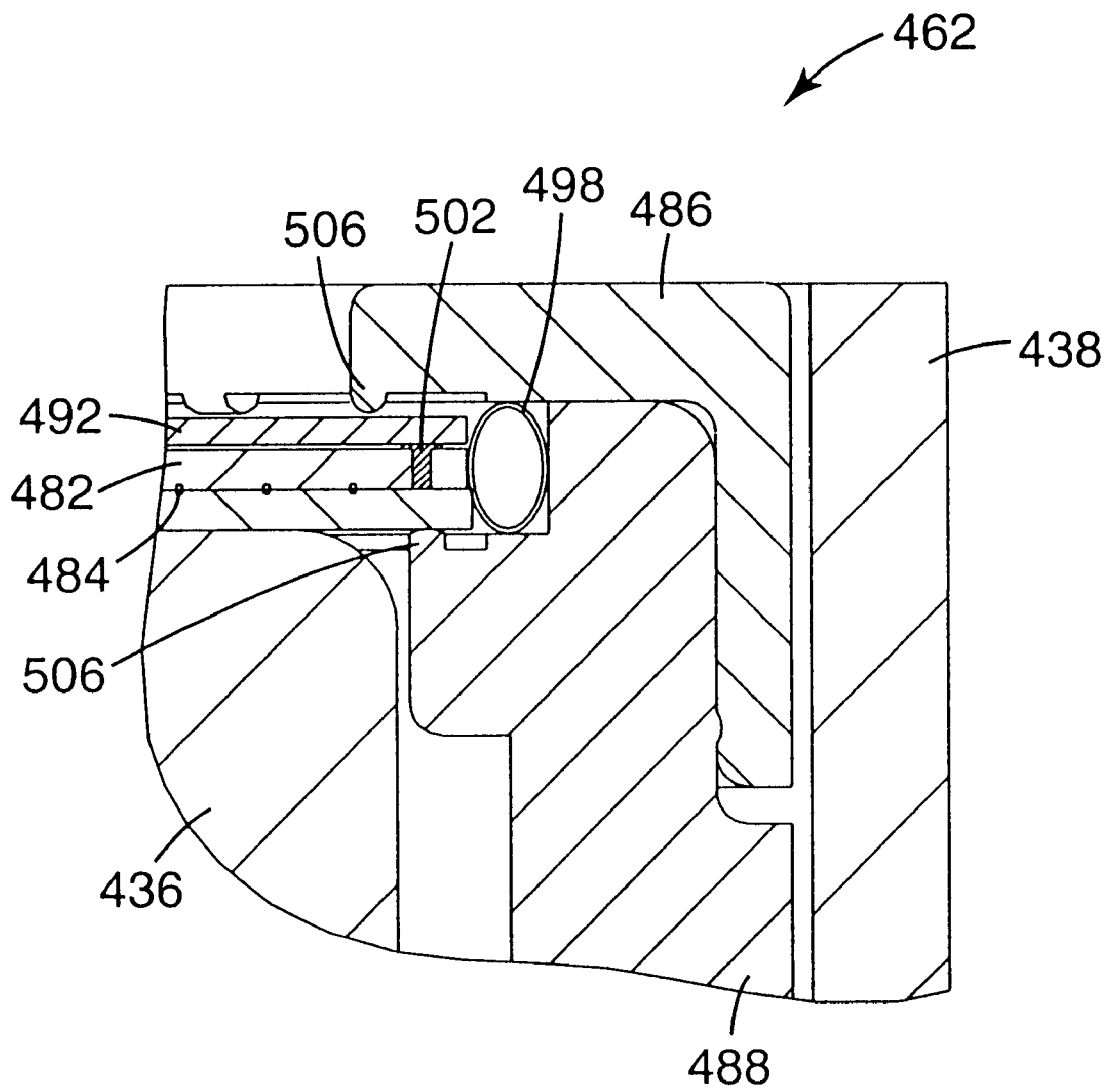
FIG. 17 is a close-up side view, in cross-section, of a portion of the apparatus of FIG. 11 showing features of the bakeplate subassembly in more detail.
Figure 18:
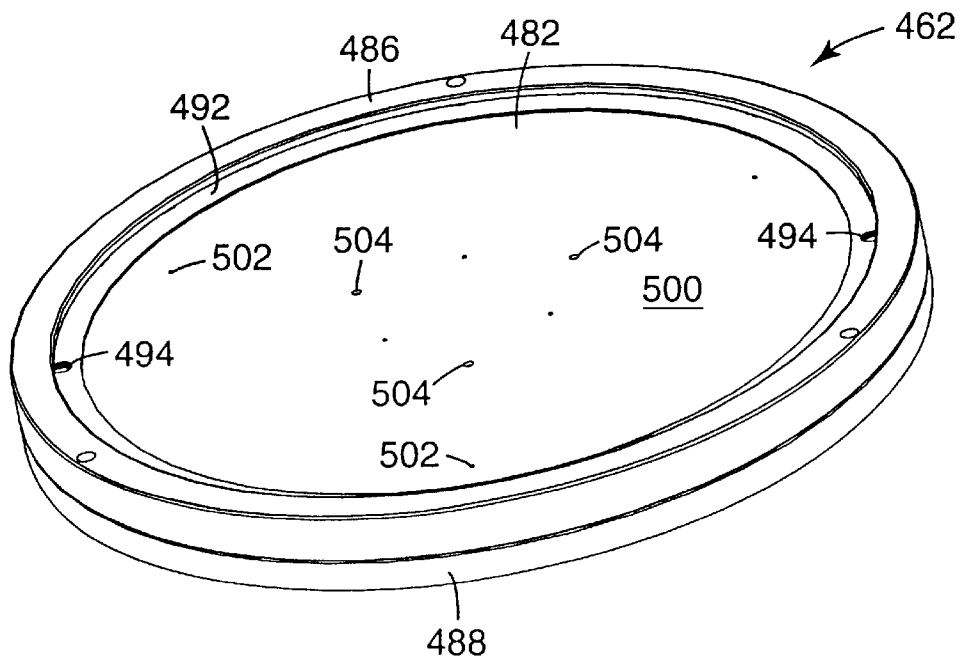
FIG. 18 is a perspective view of the bakeplate subassembly incorporated into the apparatus of FIG. 11.
Figure 19:
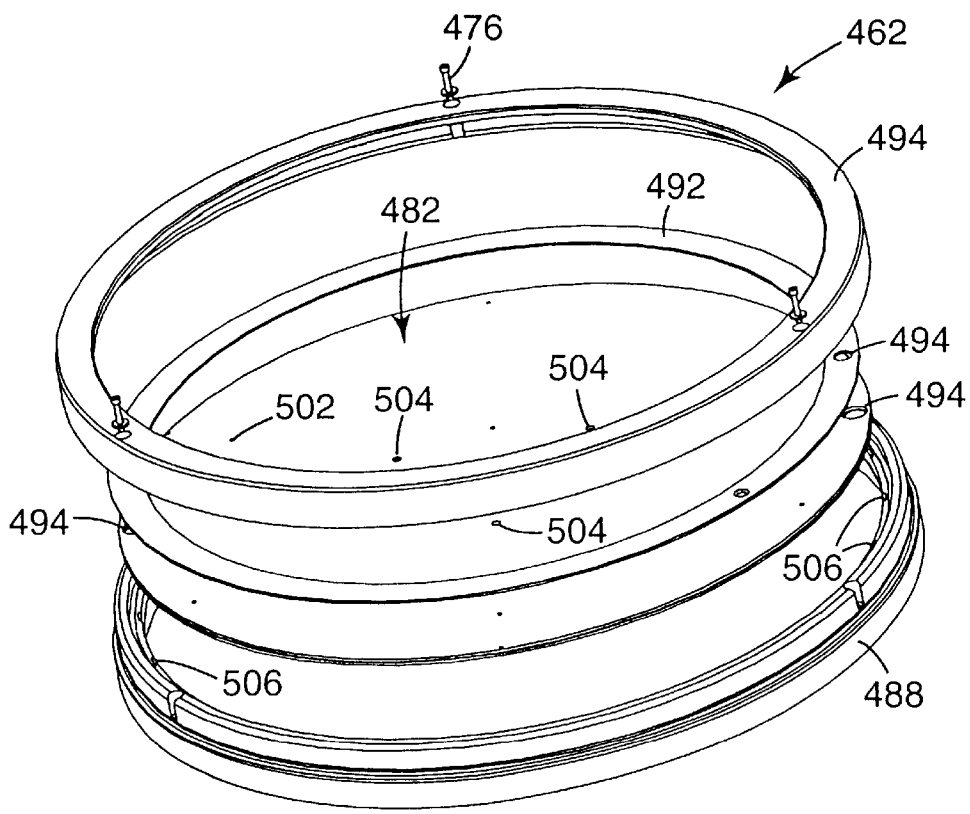
FIG. 19 is an exploded perspective view of the bakeplate subassembly of FIG. 18.

The features of bakeplate assembly 403 are best seen in FIGS. 15–19. Bakeplate assembly 403 generally includes annular heater support ring 460 that serves as a base to support bakeplate subassembly 462 upon a trio of heater support shafts 464 fixedly mounted to annular heater support ring 460. As best seen in FIGS. 16–17, each heater support shaft 464 includes relatively narrow bottom pin 470 for engaging a corresponding trio of counterbored apertures sized to receive pins 470 of a heater support shafts 464. Support shaft nuts 476 secure each shaft 464 in place. Of course, any other fastening technique (gluing, welding, press fitting, etc.) could also be used to attach shafts 464 to heater support ring 460. Preferably, at least one of heater support shafts 464 may be hollow to provide a passage through which electrical wiring or the like can be guided for coupling to bakeplate subassembly 462. Heater support ring further includes apertures 463 that allow heater support ring 460 to be coupled to drive train assembly 405 in a manner that will be described in more detail below.

At the top end of each heater support shaft 464, bakeplate subassembly 462 is secured to the top of each heater support shaft 464 using any suitable fastening technique. As shown, for example, one approach is to use heater mounting screw 465 that is threadably received in a corresponding threaded aperture at the top of each shaft 464. Thus, when heater support ring 460 is raised, bakeplate subassembly 462 is also raised. Similarly, when heater support ring 460 is lowered, bakeplate subassembly 462 is also lowered. This movement facilitates changing configurations of apparatus 400 between the loading/unloading, baking, and chilling configurations, as will be described below.

As shown best in FIGS. 15 and 16, cooling member subassembly 404 slidingly fits over heater support shafts 464 and is actually supported upon shafts 464 between bakeplate subassembly 462 and heater support ring 460. This allows bakeplate subassembly 462 to be lowered onto or raised above cooling member 434 during baking and chilling operations. Importantly, springs 478 fit over heater support shafts 464 and are positioned between heater support ring 460 and cooling member support ring 433. When apparatus 400 is in the loading/unloading configuration as illustrated in FIGS. 11–20, springs 478 firmly bias cooling member assembly 404 and bakeplate subassembly 462 together. The use of springs 478 is particularly advantageous, because they allow a simple, single lift mechanism to be used to easily place apparatus 400 into three different operational configurations.

The features of bakeplate subassembly 462 are best shown in FIGS. 15–19. There, low thermal mass, planar bakeplate 482 (schematically shown as having a two layer laminate structure for purposes of clarity) comprising an etched heating foil (schematically shown by the features designated as 484 in FIG. 17) is clamped between upper ring clamp 486 and lower ring clamp 488. Upper ring clamp 486 and lower ring clamp 488 are structured for snap fit engagement with each other and also are further secured together by screws 496. Upper ring clamp 486 and lower ring clamp 488 include a plurality of standoffs 506 between which bakeplate 482 is supported in order to minimize the area of direct contact with bakeplate 482. The use of standoffs 506 promotes more uniform, more controllable baking and chilling operations.

Upper and lower ring clamps 486 and 488 may be formed of any suitable rigid, temperature resistant material. Particularly preferred materials are also good thermal insulators. Representative examples of such materials suitable for forming clamps 486 and 488 include polyimide, polyamide, alumina, synthetic quartz or other non-alkaline ceramic materials, combinations of these, and the like. One preferred polymeric clamp material is available under the trade designation "ULTEM 2000" from Bodecker Plastics Company, Austin, Tex.

Annular member 492 has outer periphery 494 and inner periphery 496. Outer periphery 494 is sized to fit just inside upper ring clamp 486, and inner periphery defines a circular recess 498 within which wafer 540 can be positioned for processing. Top surface 500 of bakeplate 482 is provided with a plurality of protuberances 502 that support annular member 492 and wafer 540 at a uniform distance above top surface 500. Bakeplate 482 further includes a trio of through apertures 504 that allow bakeplate subassembly 462 to slideably fit over lift pins 428.

During baking and chilling, bakeplate 482 may have a tendency to expand and contract with changes in temperature. Canted coil ring 498 is positioned between bakeplate 482 and clamps 486 and/or 488 in order to accommodate such dimensional changes. In this way, free play or binding stresses that might otherwise occur are avoided.

Drive train assembly 405 is best shown in FIGS. 12–16. Drive train assembly 405 generally includes stepper motor subassembly 510, a trio of lift subassemblies 512, drive chain 514, and chain tensioner 516. Stepper motor subassembly 510 includes stepper motor 518 and powered sprocket 520. Stepper motor 518 is reversible so that powered sprocket 520 can be rotatably driven in either a forward or reverse direction. For purposes of the present invention, the "forward" direction shall be deemed to be the rotational direction that causes upward vertical movement of bakeplate and/or cooling member assemblies 403 and 404. The "reverse" direction shall be deemed to be the rotational direction that causes downward vertical movement of bakeplate and/or cooling member assemblies 403 and 404. Stepper motor 518 is mounted to main base 413 upon rubber isolation supports 519 in order to isolate motor vibration from other components of apparatus 400.

Each lift subassembly 512 generally includes a lead screw 521 rotatably supported between upper bearing 522 and lower bearing 524. Upper bearing 522 is positioned in upper support arm 526 supported at the top end of lead screw 521 by brace 528. Lower bearing 524 is positioned in foot 525 that, in turn, is mounted to main base 413. A chain sprocket 530 is fixedly coupled to the bottom of each lead screw 521 so that rotary motion of chain sprocket 530 also causes the corresponding lead screw 521 to rotate in a corresponding manner.

Rotary motion from powered sprocket 520 is transferred to each chain sprocket 530, and hence to each lead screw 521, by closed-loop drive chain 514 traversing a path defined at least in part by chain sprockets 530. Chain tensioner includes idler sprocket 532 and adjustable plate 534 and arm 535 so that the tension of drive chain 514 can be easily adjusted.

Each lead screw 521 includes spring-biased, lead screw follower 536 threadably received on the corresponding lead screw and fixedly secured to heater support ring 460 in a manner such that lead screw followers 536 cannot rotate relative to heater support ring 460. Retainer 538 helps hold each lead screw follower in proper position. Accordingly, each lead screw 521 can rotate inside its lead screw follower 536, yet each lead screw follower 536 does not rotate. As a consequence, rotation of lead screws 521 in the forward direction drives lead screw followers 536, and hence heater support ring 460, vertically upward. Similarly, rotation of lead screws 521 in the reverse direction drives lead screw followers 526, and hence heater support ring 460, vertically downward.

Figure 20:
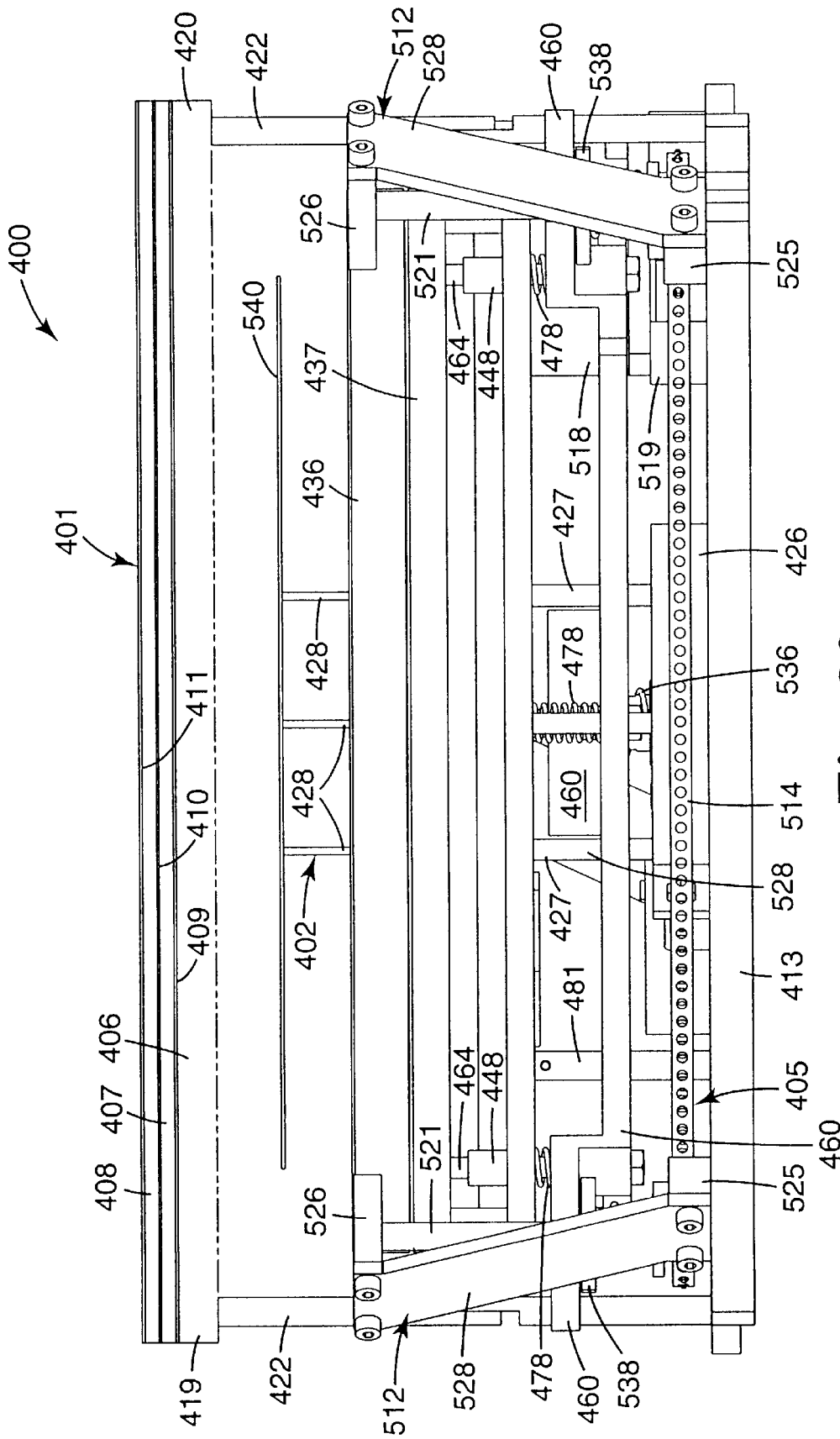
FIG. 20 is a side view of the apparatus of FIG. 11 shown in a loading/unloading configuration with some elements removed to better show this configuration.

A preferred mode of operation of apparatus 400 will now be described with respect to FIGS. 20–22. In FIG. 20, apparatus 400 is in the loading/unloading configuration in which apparatus 400 is open allowing wafer 540 to be inserted and removed to and from the inside of apparatus 400. In this configuration, bakeplate subassembly 462 is pulled against the top of upper chill plate 436 by the action of springs 478, and lift pins 428 project well above bakeplate subassembly 462. This allows wafer 540 to be placed onto lift pins 428 for processing.

Figure 21:
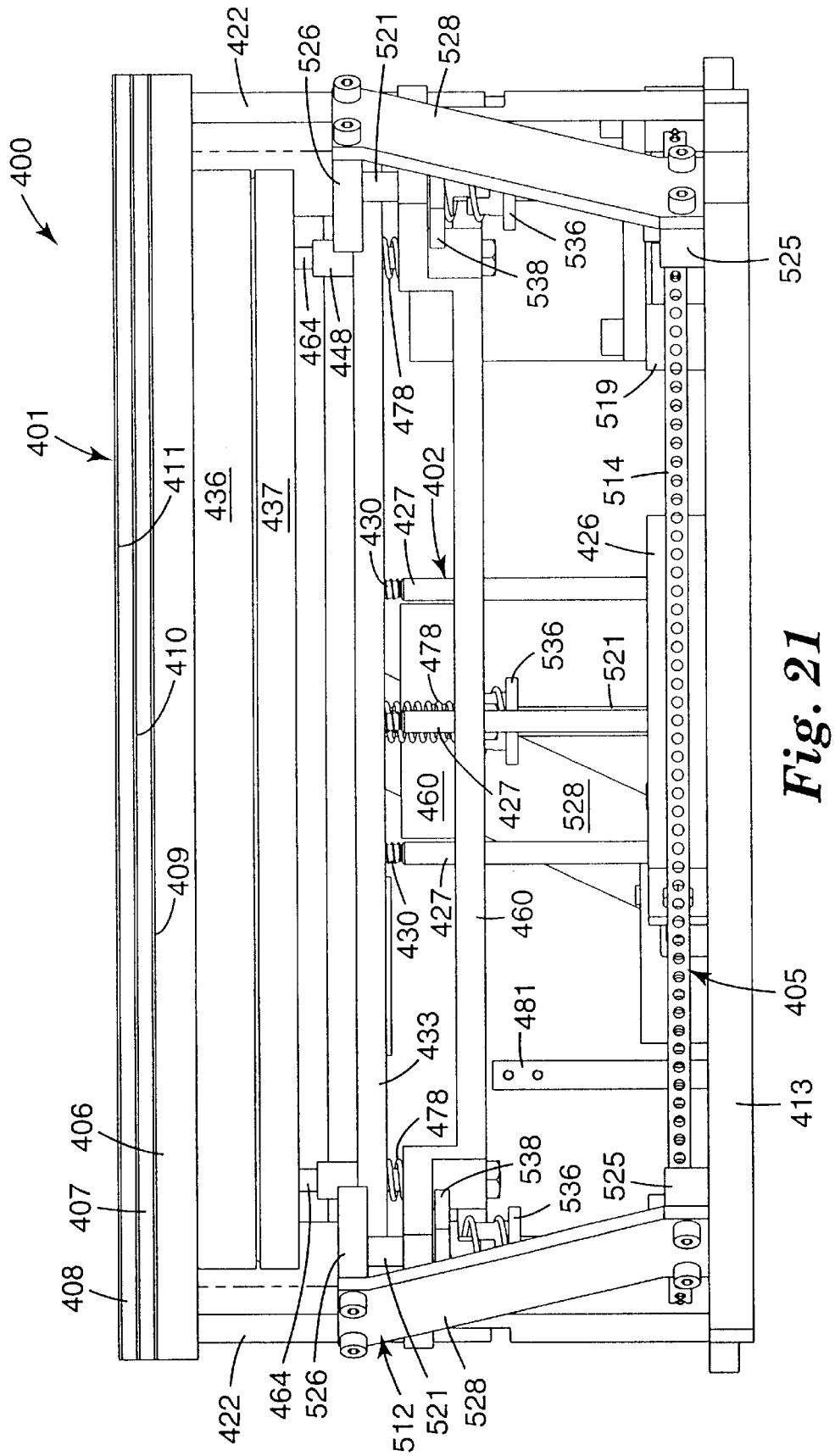
FIG. 21 is a side view of the apparatus of FIG. 11 shown in a chilling configuration with some elements removed to better show this configuration.

FIG. 21 shows apparatus 400 in the chill configuration. To change from the loading/unloading configuration of FIG. 20 to the chill configuration, stepper motor 518 is actuated to drive lead screws 521 in the forward direction. This drives lead screw follower 536 up lead screw 521. Heater support ring 460 and bakeplate subassembly 462, fixedly coupled to lead screw followers 536, are driven upward as well. In the meantime, the upward motion of heater support ring 460 causes springs 478 to exert an upward force against flange 450 of flanged, hollow bearings 448. This drives cooling member assembly 404 upward as well. Stepper motor 518 drives lead screws 521 in the forward direction until sidewall member 438 of cooling member assembly 404 engages lid assembly 401, closing apparatus 400. The presence of an o-ring gasket (not shown) in the optional groove (not shown) on the top of sidewall member 438 allows a good seal to be achieved within a practical range of upward motion. This allows the chill configuration to be achieved after apparatus 400 is closed and while cooling member assembly 404 and bakeplate subassembly 462 are still being pulled together by the action of springs 478. As cooling member assembly 404 and bakeplate subassembly 462 are driven upward to the chill configuration, wafer 540 is lifted off lift pins 428 and is thereafter supported on protuberances 502.

Thus, in changing apparatus 400 from the loading/unloading configuration to the chill configuration, bakeplate assembly 403 and cooling member assembly 404 move upward in concerted fashion. In the resultant chill configuration, wafer 540 is supported upon bakeplate 482 of bakeplate subassembly 462, and bakeplate subassembly 462, in turn, is pulled against upper chill plate 436. In practical effect, upper chill plate 436 is in thermal contact with wafer 540 so that chill operations can now be carried out. Apparatus 400 can be returned to the loading/unloading configuration by actuating stepper motor 518 to drive lead screws 521 in the reverse direction.

Figure 22:
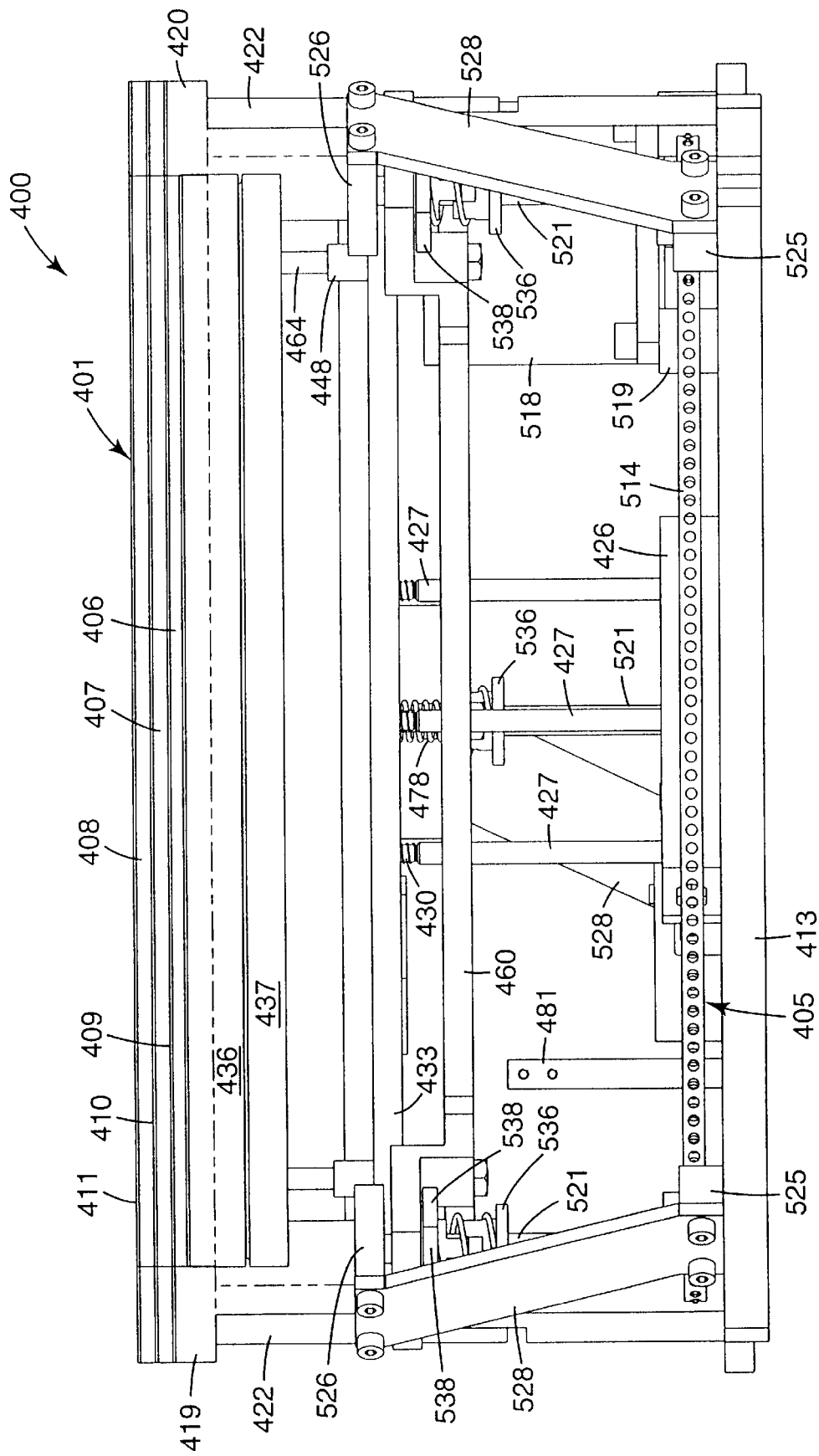
FIG. 22 is a side view of the apparatus of FIG. 11 shown in a baking configuration with some elements removed to better show this configuration.

FIG. 22 shows apparatus in the bake configuration. To change from the chill configuration of FIG. 21 to the bake configuration, stepper motor 518 is actuated to drive lead screws 521 in the forward direction. This drives lead screw followers 536 further upward from the position of lead screw followers 536 associated with the chill configuration. However, in this situation, further upward motion of cooling assembly 404 is prevented by lid assembly 401. Accordingly, only bakeplate assembly 403 is driven further upward. This is shown in FIG. 22 by the increased compression of springs 478 as heater support ring 460 has been driven upward toward the now stationary chill plate support ring 433. In this configuration, bakeplate subassembly 462 has been lifted out of thermal contact with upper chill plate 436 so that bake operations can now be carried out. Apparatus 400 can be returned to either the chill configuration or the loading/unloading configuration by actuating stepper motor 518 to drive lead screws 521 in the reverse direction.

Other embodiments of this invention will be apparent to those skilled in the art upon consideration of this specification or from practice of the invention disclosed herein. Various omissions, modifications, and changes to the principles and embodiments described herein may be made by one skilled in the art without departing from the true scope and spirit of the invention which is indicated by the following claims.

What is claimed is:

1. An apparatus suitable for controlling the temperature of a workpiece, said apparatus comprising:
   (a) a low thermal mass, thermally conductive, heating member having a surface adapted for supporting the workpiece in thermal contact with the heating member such that heat energy from the heating member can be transferred to the workpiece during baking; and
   (b) a high thermal mass chilling member; and
   wherein the apparatus operatively supports the heating member and the chilling member in a first configuration in which the chilling member is in sufficiently close physical proximity to be in thermal contact with the heating member and a second configuration in which the heating member and the chilling member are spaced farther apart from each other as compared to the first configuration such that the heating member and the chilling member are more thermally decoupled.

2. The apparatus of claim 1, wherein the workpiece comprises a microelectronic device.

3. The apparatus of claim 1, wherein the heating member has opposed first and second major surfaces, and wherein the first major surface corresponds to the workpiece supporting surface and the second major surface of the heating member and the chilling member are in thermal contact when the apparatus is in the first configuration, and wherein the heating member and the chilling member are thermally decoupled by physical separation between the second major surface of the heating member and the chilling member when the apparatus is in the second configuration.

4. The apparatus of claim 1, wherein the heating member is a laminate comprising at least:
   (a) a substrate ply; and
   (b) a heater ply laminated to the substrate ply, wherein the heater ply comprises at least one controllable heating zone.

5. The apparatus of claim 1, wherein the apparatus further comprises a frame member provided on the workpiece supporting surface, said frame member having an interior space adapted to receive the workpiece.

6. The apparatus of claim 5, wherein the ratio of the thermal diffusivity of the workpiece to that of frame member is in the range from 0.8:1 to 1:0.8.

7. The apparatus of claim 5, wherein the workpiece is a microelectronic device, and wherein the frame member comprises a material selected from silicon, aluminum, germanium, gallium-arsenide, glass, stainless steel, an aluminum alloy, an intermetallic composition comprising aluminum, a magnesium alloy, an intermetallic composition comprising magnesium, and combinations thereof.

8. The apparatus of claim 5, wherein the workpiece comprises at least 98% by weight of said material, and wherein the frame member comprises at least 98% by weight of the same material.

9. The apparatus of claim 5, wherein the frame member and the workpiece each have substantially the same thickness.

10. The apparatus of claim 5, further comprising at least one temperature sensor coupled to the frame member.

11. The apparatus of claim 10, wherein the temperature sensor is an RTD device.

12. The apparatus of claim 1, further comprising:
   (i) a first temperature sensor coupled to the heating member in a position effective for sensing a first temperature signal corresponding to the temperature of the workpiece, said first temperature sensor having a first temperature sensing time constant and a first temperature sensing stability;
   (ii) a second temperature sensor coupled to the heating member in a position effective for sensing a second temperature signal corresponding to the temperature of the workpiece, said second temperature sensor having a second temperature sensing time constant and a second temperature sensing stability, wherein the second temperature sensing time constant is greater than the first temperature sensing time constant and the first temperature sensing stability is greater than the second temperature sensing stability.

13. The apparatus of claim 12, further comprising a control system operationally coupled to the first and second temperature sensors and comprising program instructions enabling the control system to use information comprising the first and second temperature signals to automatically, on-line calibrate the first temperature sensor.

14. The apparatus of claim 12, wherein the apparatus further comprises a frame member provided on the workpiece supporting surface, said frame member having an interior space adapted to receive the workpiece, and wherein the first and second temperature sensors are coupled to the frame member.

15. The apparatus of claim 12, wherein the first temperature sensor is a thin-film, resistive temperature device (RTD) sensor.

16. The apparatus of claim 12, wherein the second temperature sensor is a thermocouple (TC) sensor.

17. The apparatus of claim 12, wherein the first temperature sensor is a thin-film, resistive temperature device sensor and the second temperature sensor is a thermocouple sensor.

18. The apparatus of claim 1, wherein the heating member comprises first and second independently controllable heating zones.

19. The apparatus of claim 5, wherein the heating member comprises a first controllable heating zone underlying at least a portion of the interior space of the frame member and a second controllable heating zone surrounding the first heating zone and underlying at least a portion of the frame member.

20. The apparatus of claim 5, wherein the heater ply comprises a controllable heating zone that underlies the interior space of the frame member and at least a portion of the frame member.

21. The apparatus of claim 1, wherein the workpiece supporting surface of the heating member further comprises a plurality of protuberances for supporting the workpiece.

22. A heating device for heating a microelectronic device, said heating device comprising:
   (a) a low thermal mass, thermally conductive heating member; and
   (b) a frame member provided on a surface of the heating member and having an interior space adapted to receive the microelectronic device.

23. The heating device of claim 22, further comprising a plurality of protuberances projecting upward from a surface of the heating member to support at least one of the frame member and the microelectronic device.

24. The heating device of claim 22, wherein the microelectric device comprises a semiconductor device and the frame member is annularly shaped.

25. The heating device of claim 22, wherein the wherein the ratio of the thermal diffusivity of the microelectronic device to that of frame member is in the range from 0.8:1 to 1:0.8.

26. The heating device of claim 22, wherein the ratio of the thermal capacity of the heating member to the microelectronic device is in the range from about 1:100 to about 5:1.

27. The heating device of claim 22, wherein the ratio of the thermal capacity of the heating member to the microelectronic device is in the range from about 1:10 to about 2:1.

28. The heating device of claim 22, wherein the ratio of the thermal diffusivity of the microelectronic device to that of frame member is about 1:1.

29. The heating device of claim 22, wherein the frame member comprises a material selected from silicon, aluminum, germanium, gallium-arsenide, glass, stainless steel, an aluminum alloy, an intermetallic composition comprising aluminum, a magnesium alloy, an intermetallic composition comprising magnesium, and combinations thereof.

30. The apparatus of claim 22, wherein the workpiece comprises at least 98% by weight of said material, and wherein the frame member comprises at least 98% by weight of the same material.

31. The heating device of claim 22, wherein the frame member and the microelectronic device have substantially the same thickness.

32. The heating device of claim 22, wherein the heating member comprises first and second independently controllable heating zones.

33. The heating device of claim 22, wherein the heating member comprises a first controllable heating zone underlying at least a portion of the interior space of the frame member and a second controllable heating zone surrounding the first heating zone and underlying at least a portion of the frame member.

34. The heating device of claim 22, further comprising at least one temperature sensor coupled to the frame member.

35. The heating device of claim 34, wherein the temperature sensor is an RTD device.

36. The heating device of claim 22, further comprising:
   (i) a first temperature sensor coupled to the heating device in a position effective for a firs t temperature signal corresponding to the temperature of the microelectronic device, said first temperature sensor having a first temperature sensing time constant and a first temperature sensing stability;
   (ii) a second temperature sensor coupled to the heating device in a position effective for sensing a second temperature signal corresponding to the temperature of the microelectronic device, said second temperature sensor having a second temperature sensing time constant and a second temperature sensing stability, wherein the second temperature sensing time constant is greater than the first temperature sensing time constant and the first temperature sensing stability is greater than the second temperature sensing stability.

37. The heating device of claim 36, further comprising a control system operationally coupled to the first and second temperature sensors and comprising program instructions enabling the control system to use information comprising the first and second temperature signals to automatically, on-line calibrate the first temperature sensor.

38. The heating device of claim 36, wherein the first and second temperature sensors are coupled to the frame member.

39. The heating device of claim 36, wherein the first temperature sensor is a thin-film, resistive temperature device (RTD) sensor.

40. The heating device of claim 36, wherein the second temperature sensor is a thermocouple (TC) sensor.

41. The heating device of claim 36, wherein the first temperature sensor is a thin-film, resistive temperature device sensor and the second temperature sensor is a thermocouple sensor.

42. A system for controlling the temperature of an object, said system comprising:
   (a) at least one temperature sensor coupled to the system in a position effective to generate output temperature signals indicative of the temperature of the object;
   (b) a source of a pulse width modulated (PWM) control signal having a controllably variable duty cycle, wherein the PWM control signal is derived from information comprising the temperature signals; and
   (c) a low thermal mass, thermally conductive heating member that comprises a surface for supporting the object during heating, said heating member having a controllable heat output level corresponding to the duty cycle of the PWM control signal.

43. The system of claim 42, wherein the system further comprises a switch electrically coupled to the source of the PWM control signal and the heating member in a manner such that actuation of the switch by the PWM control signal causes a voltage level to develop across the heating member that corresponds to the duty cycle of the PWM control signal.

44. The system of claim 43, wherein the switch is an IGBT transistor.

45. The system of claim 42, wherein the system comprises a load circuit, said load circuit comprising an inductor connected in series with an RC circuit, wherein the RC circuit comprises a capacitor and a resistor connected in parallel, said resistor corresponding to the heating member.

46. The system of claim 45, further comprising a switch electrically coupled to the load circuit and the load circuit, said switch being responsive to the PWM control signal to modulate the heating output of the heating member when a load circuit voltage is developed across the load circuit.

47. The system of claim 45, wherein the load circuit further comprises a bottom terminal, a top terminal, and a diode electrically connected to the bottom terminal and top terminal such that the diode is forward biased with respect to current flowing from the bottom terminal to the top terminal.

48. The system of claim 42, wherein the source of the PWM control signal comprises a controller comprising a DSP.

49. The system of claim 40, wherein the object comprises a microelectronic device.

50. The system of claim 40, wherein the temperature sensor is a resistive temperature device (RTD) sensor.

51. The system of claim 40, wherein the PWM control signal has a frequency in the range from at least 1000 Hz to about 50,000 Hz.

52. The system of claim 40, wherein the PWM control signal has a frequency of about 20,000 Hz.

53. The system of claim 40, wherein the source of the PWM control signal develops the PWM control signal by applying PID control methodology to the temperature signals.

54. A method of cooling a workpiece to a cooled temperature ($T_c$), comprising the steps of:
 (a) supporting the workpiece in thermal contact with a low thermal mass, thermally conductive support, wherein the workpiece is at a temperature above $T_c$;
 (b) placing the low thermal mass support into thermal contact with a chilling member maintained at a temperature below $T_c$ such that the workpiece is chilled via heat conduction through said support;
 (c) monitoring the temperature of the support during cooling; and
 (d) ceasing further chilling when the support is at a temperature substantially corresponding to $T_c$, wherein said ceasing further chilling comprises physically separating the heating member from the chilling member.

55. The method of claim 54, wherein step (d) comprises heating the workpiece while the workpiece is in thermal contact with the chilling member under conditions effective to maintain the workpiece at $T_c$.

56. The method of claim 54, wherein the workpiece comprises a microelectronic device.

57. The method of claim 54, wherein the support is a relatively low thermal mass, thermally conductive, controllably heatable heating member having first and second major opposed surfaces, and step (a) comprises supporting the workpiece on the first major surface of the heating member.

58. The method of claim 57, wherein step (b) comprises bringing the second major surface of the heating member into thermal contact with the chilling member such that the workpiece supported upon the first major surface of the heating member is thereby cooled.

59. A sheet-shaped, laminated, low thermal mass, thermally conductive heating member for heating a workpiece, comprising first and second opposed major surfaces corresponding to a workpiece supporting surface and a workpiece chilling surface, respectively, wherein a workpiece positioned on the supporting surface can be chilled when the chilling surface is placed into thermal contact with a heat sink.

60. The heating member of claim 59, wherein the apparatus further comprises a frame member provided on the workpiece supporting surface, said frame member having an interior space adapted to receive the workpiece.

61. The heating member of claim 60, wherein the ratio of the thermal diffusivity of the workpiece to that of frame member is in the range from 0.8:1 to 1:0.8.

62. The heating member of claim 60, wherein the workpiece is a microelectronic device, and wherein the frame member comprises at least 80% by weight of a material selected from silicon, aluminum, germanium, gallium-arsenide, glass, stainless steel, an aluminum alloy, an intermetallic composition comprising aluminum, a magnesium alloy, an intermetallic composition comprising magnesium, and combinations thereof.

63. The heating member of claim 60, wherein the workpiece comprises at least 98% by weight of said material, and wherein the frame member comprises at least 98% by weight of the same material.

64. The heating member of claim 60, wherein the frame member and the workpiece each have substantially the same thickness.

65. The heating member of claim 60, further comprising at least one temperature sensor coupled to the frame member.

66. The heating member of claim 65, wherein the temperature sensor is an RTD device.

67. The heating member of claim 59, further comprising:
 (i) a first temperature sensor coupled to the heating member in a position effective for sensing a first temperature signal corresponding to the temperature of the workpiece, said first temperature sensor having a first temperature sensing time constant and a first temperature sensing stability;
 (ii) a second temperature sensor coupled to the heating member in a position effective for sensing a second temperature signal corresponding to the temperature of the workpiece, said second temperature sensor having a second temperature sensing time constant and a second temperature sensing stability, wherein the second temperature sensing time constant is greater than the first temperature sensing time constant and the first temperature sensing stability is greater than the second temperature sensing stability.

68. The heating member of claim 67, further comprising a control system operationally coupled to the first and second temperature sensors and comprising program instructions enabling the control system to use information comprising the first and second temperature signals to automatically, on-line calibrate the first temperature sensor.

69. The heating member of claim 67, wherein the heating member comprises a frame member provided on the workpiece supporting surface, said frame member having an interior space adapted to receive the workpiece, and wherein the first and second temperature sensors are coupled to the frame member.

70. The heating member of claim 67, wherein the first temperature sensor is a thin-film, resistive temperature device (RTD) sensor.

71. The heating member of claim 67, wherein the second temperature sensor is a thermocouple (TC) sensor.

72. The heating member of claim 67, wherein the first temperature sensor is a thin-film, resistive temperature device sensor and the second temperature sensor is a thermocouple sensor.

73. The heating member of claim 59, wherein the heating member comprises a first and second independently controllable heating zones.

74. The heating member of claim 60, wherein the heating member comprises a first controllable heating zone underlying at least a portion of the interior space of the frame member and a second controllable heating zone surrounding the first heating zone and underlying at least a portion of the frame member.

75. The heating member of claim 60, wherein the heater ply comprises a controllable heating zone that underlies the interior space of the frame member and at least a portion of the frame member.

76. The heating member of claim 59, wherein the workpiece supporting surface of the heating member further comprises a plurality of protuberances for supporting the workpiece.

77. The heating member of claim 59, wherein the heating member has a symmetrical sandwich structure.

78. The heating member of claim 59, wherein the heating member has a symmetrical sandwich structure comprising a heater ply sandwiched between first and second structural plies.

79. The heating member of claim 78, wherein the symmetrical sandwich structure further comprises a dielectric layer interposed between the heater ply and each structural ply.

80. The heating member of claim 59, wherein the heating member comprises:
   (a) a first electrically insulative layer;
   (b) a heater ply laminated to said first electrically insulative layer;
   (c) a second electrically insulative layer provided over the heater ply;
   (d) a substrate provided over the second electrically insulative layer; and
   (e) a plurality of protuberances provided on the substrate for supporting the workpiece.

81. The heating member of claim 59, wherein the heating member comprises:
   (a) a substrate;
   (b) a first electrically insulative layer laminated to the substrate;
   (c) a heater ply laminated to said first electrically insulative layer;
   (d) a second electrically insulative layer laminated over the heater ply; and
   (e) a plurality of protuberances provided on the second electrically insulative layer for supporting the workpiece.

82. The heating member of claim 59, wherein the heating member comprises at least one layer comprising a polyamide resin.

83. The heating member of claim 59, wherein the heating member comprises at least one layer comprising a substantially alkaline-free, vitrified porcelain frit.

84. The heating member of claim 59, wherein the heating member comprises a substrate ply laminated to a heater ply and wherein the heater ply is a resistance heating element.

85. An apparatus for controlling the temperature of a workpiece, said apparatus comprising:
   (a) a sheet-shaped, low thermal mass, thermally conductive heating member comprising first and second opposed major surfaces corresponding to a workpiece supporting surface and a workpiece chilling surface, respectively, and
   (b) a chilling member; and
      wherein the apparatus operatively supports the heating member and the chilling member in a first configuration in which the heating member and the chilling member are subjected to a bias tending to pull the workpiece chilling surface into thermal contact with the chilling member, and
      wherein the apparatus operatively supports the heating member and the chilling member in a second configuration in which the bias is overcome and the workpiece chilling surface and the chilling member are thermally decoupled.

86. A method of baking and chilling a workpiece, comprising the steps of:
   (a) heating the workpiece while the workpiece is supported upon a sheet-shaped, low thermal mass, thermally conductive heating member comprising first and second opposed major surfaces, said first major surface supporting the workpiece;
   (b) placing the second major surface of the bakeplate into thermal contact with a chilling member; and
   (c) while the second major surface of the bakeplate is in thermal contact with the chilling member, controlling the heat output of the heating member such that the workpiece supported upon the first major surface is chilled.

87. A method of baking a workpiece, comprising the step of heating the workpiece while the workpiece is supported upon a sheet-shaped, laminated, heating member comprising a substantially planar substrate ply and a heater ply laminated to the substrate ply, wherein the heater ply comprises at least one controllable heater zone.

* * * * *

UNITED STATES PATENT AND TRADEMARK OFFICE
CERTIFICATE OF CORRECTION

PATENT NO. : 6,072,163
DATED : June 6, 2000
INVENTOR(S) : Armstrong et al.

It is certified that error appears in the above-identified patent and that said Letters Patent is hereby corrected as shown below:

Column 35,
Line 27, the first occurrence of "wherein the" should be deleted.

Column 36,
Line 3, "for a firs t" should be -- for sensing a first --.

Column 37,
Lines 11, 13, 15, 18 and 21, "claim 40" should be -- claim 42 --.

Column 40,
Line 44, after "laminated," please insert -- low thermal mass, thermally conductive --.

Signed and Sealed this

Second Day of March, 2004

JON W. DUDAS
*Acting Director of the United States Patent and Trademark Office*